US009345168B2

(12) United States Patent
Suzuki et al.

(10) Patent No.: US 9,345,168 B2
(45) Date of Patent: May 17, 2016

(54) POWER CONVERSION APPARATUS

(71) Applicant: Hitachi Automotive Systems, Ltd., Hitachinaka-shi, Ibaraki (JP)

(72) Inventors: Hideyo Suzuki, Hitachinaka (JP); Masashi Kosuga, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 0 days.

(21) Appl. No.: 14/418,985

(22) PCT Filed: Jul. 19, 2013

(86) PCT No.: PCT/JP2013/069581
§ 371 (c)(1),
(2) Date: Feb. 2, 2015

(87) PCT Pub. No.: WO2014/041892
PCT Pub. Date: Mar. 20, 2014

(65) Prior Publication Data
US 2015/0163962 A1 Jun. 11, 2015

(30) Foreign Application Priority Data
Sep. 14, 2012 (JP) .................................. 2012-202185

(51) Int. Cl.
*H05K 7/20* (2006.01)
*H02M 7/00* (2006.01)

(52) U.S. Cl.
CPC ........... *H05K 7/20254* (2013.01); *H02M 7/003* (2013.01); *H05K 7/20927* (2013.01)

(58) Field of Classification Search
CPC ....................... H05K 7/20254; H05K 7/20927
See application file for complete search history.

(56) References Cited

U.S. PATENT DOCUMENTS

| 2003/0133259 | A1* | 7/2003 | Meyer ..................... B60L 11/12 361/677 |
| 2008/0049476 | A1* | 2/2008 | Azuma ..................... B60L 3/12 363/131 |

(Continued)

FOREIGN PATENT DOCUMENTS

| JP | 2009-219270 A | 9/2009 |
| JP | 2009-295632 A | 12/2009 |
| JP | 2010-252461 A | 11/2010 |

OTHER PUBLICATIONS

International Search Report (PCT/ISA/210) dated Oct. 8, 2013 with English translation (three pages).

*Primary Examiner* — Gregory Thompson
(74) *Attorney, Agent, or Firm* — Crowell & Moring LLP

(57) ABSTRACT

An object of the present invention is to improve the cooling performance of a capacitor module used in a power conversion apparatus. The power conversion apparatus according to the present invention includes a power semiconductor module, a capacitor module, a flow path forming body that forms a flow path through which a cooling refrigerant flows . The flow path forming body includes a first flow path forming body that forms a first flow path part for cooling the power semiconductor module, and a second flow path forming body that forms a second flow path part for cooling the capacitor module. The first flow path forming body is provided on a side portion of the second follow path forming body and is integrally formed with the second flow path forming body. The second flow path forming body forms a housing space for housing the capacitor module above the second flow path part . The first flow path part is formed at a position facing the side wall that forms the housing space. The power semiconductor module is inserted into the first flow path part.

15 Claims, 16 Drawing Sheets

(56) References Cited

U.S. PATENT DOCUMENTS

| | | |
|---|---|---|
| 2009/0231811 A1 | 9/2009 | Tokuyama et al. |
| 2010/0259898 A1 | 10/2010 | Kimura et al. |
| 2011/0069455 A1* | 3/2011 | Tokuyama ............ H01L 23/473 361/702 |
| 2013/0279114 A1* | 10/2013 | Nishikimi ................ B60K 6/28 361/699 |
| 2013/0294040 A1* | 11/2013 | Fukumasu .............. H02M 1/44 361/752 |
| 2014/0160823 A1* | 6/2014 | Uetake .................. H02M 7/003 363/141 |
| 2015/0163961 A1* | 6/2015 | Hara ..................... H02M 7/003 361/699 |

* cited by examiner

F I G . 1
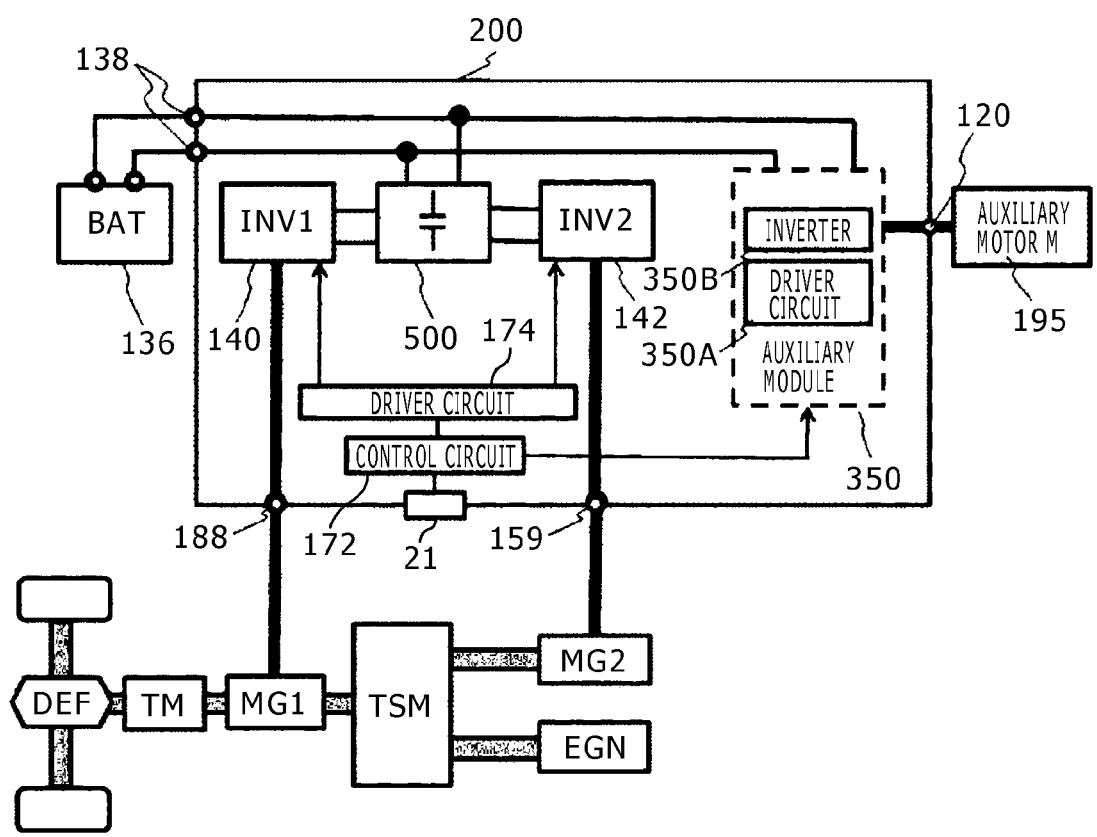

F I G . 2
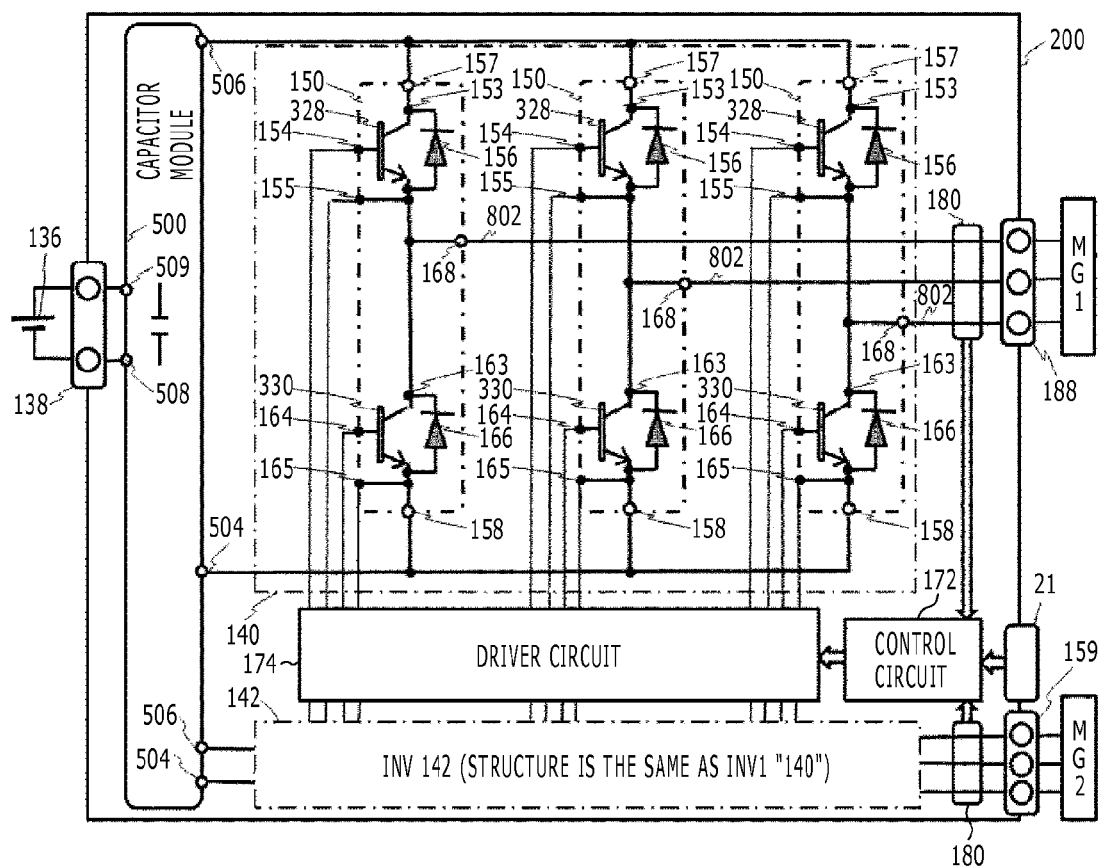

(a)

(b)

(a)

(b)

(a)

(b)

POWER CONVERSION APPARATUS

TECHNICAL FIELD

The present invention relates to a power conversion apparatus used to convert DC power to AC power or to convert AC power to DC power, and more particularly to a power conversion apparatus used for hybrid electric vehicles and electric vehicles.

BACKGROUND ART

In general, a power conversion apparatus includes a smoothing capacitor module for receiving DC power from a DC power supply, an inverter circuit for receiving the DC power from the capacitor module to generate AC power, and a control circuit for controlling the inverter circuit. In recent years, it has been required for high output in a power conversion apparatus. In particular, in the field of hybrid electric vehicles and electric vehicles, the operating time using a motor as a drive source, as well as the operating conditions (high output torque conditions) tend to increase. Thus, the DC power supplied from the DC power supply to the power conversion apparatus tends to increase as well. The greater the DC power supplied from the DC power supply, the greater the heat generated in a capacitor cell and a bus bar that are provided in the capacitor module.

Japanese Unexamined Patent Application Publication No. 2009-219270 discloses an example of a power conversion apparatus in which a flow path is formed to surround a capacitor module, in order to improve the cooling performance of the capacitor module.

However, there is a demand for further improvement of the cooling performance of the capacitor module.

CITATION LIST

Patent Literature

Patent Literature 1: Japanese Unexamined Patent Application Publication No. 2009-219270

SUMMARY OF INVENTION

1. Technical Problem

An object of the present invention is to improve the cooling performance of a capacitor module used in a power conversion apparatus.

2. Solution to Problem

In order to solve the above problem, a power conversion apparatus according to the present invention includes a flow path forming body for cooling a power semiconductor module and a capacitor module. The flow path forming body forms a housing space for housing the capacitor module above a second flow path part to cool the capacitor module. Then, a first flow path part is formed at a position facing the side wall that forms the housing space.

Because of this structure, the capacitor module is cooled by the bottom and side surfaces of the capacitor module, so that the cooling performance of the capacitor module is improved.

ADVANTAGEOUS EFFECTS OF INVENTION

According to the present invention, it is possible to improve the cooling performance of the capacitor module.

BRIEF DESCRIPTION OF DRAWINGS

FIG. 1 is a system diagram showing a system of a hybrid electric vehicle.

FIG. 2 is a circuit diagram showing the structure of the electrical circuit shown in FIG. 1.

FIG. 6(a) is a perspective view showing the external appearance of a power semiconductor module 300a, and FIG. 6(b) is a cross-sectional view of the power semiconductor module 300a.

FIGS. 8 are views of the power semiconductor module 300a with a module case 304 further removed from the state shown in FIG. 7, in which FIG. 8(a) is a perspective view, and FIG. 8(b) is a cross-sectional view similar to FIG. 7(b) taken along the cross section D as viewed from the direction E.

FIG. 11(b) is an exploded perspective view showing the internal structure of the capacitor module 500.

DESCRIPTION OF EMBODIMENTS

Figure 3:
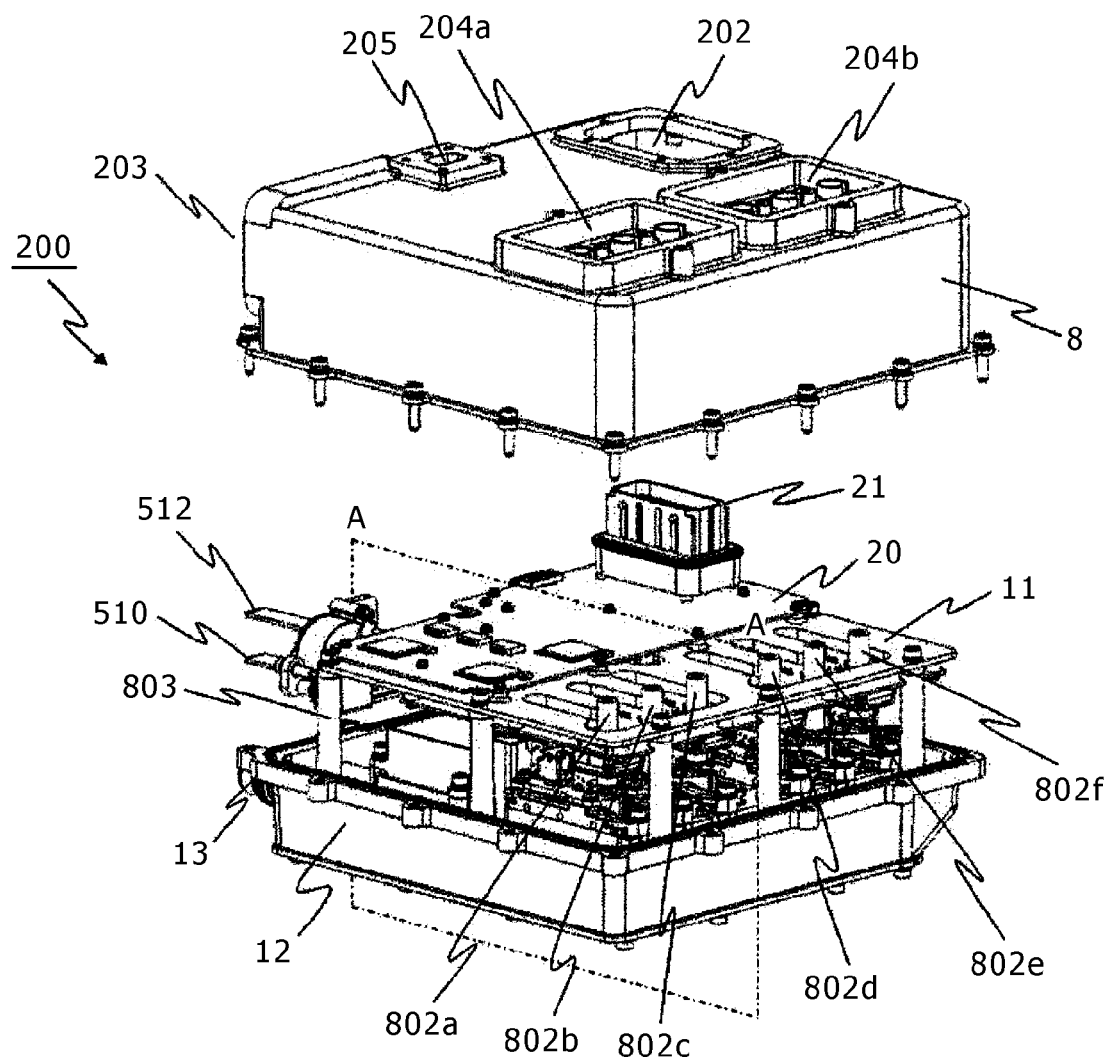
FIG. 3 is an exploded perspective view showing the structure of a power conversion apparatus.

Next, an embodiment of the present invention will be described with reference to the accompanying drawings. FIG. 1 is a system diagram in which a power conversion apparatus according to the present invention is applied to the so-called hybrid electric vehicle that runs by both an engine and a motor. The power conversion apparatus according to the present invention can be applied not only to the hybrid electric vehicle but also the so-called electric vehicle that runs only by a motor. Further, the power conversion apparatus can also be used as a power conversion apparatus for driving motors used in general industrial machinery. However, as described above or below, in particular when the power conversion apparatus according to the present invention is applied to the hybrid electric vehicle and the electric vehicle, an excellent effect can be obtained in terms of various aspects such as downsizing and reliability. The power conversion apparatus applied to the hybrid electric vehicle has substantially the same structure as that of the power conversion apparatus applied to the electric vehicle. Thus, the power conversion apparatus applied to the hybrid electric vehicle will be described as a typical example.

FIG. 1 is a view of a control block of a hybrid electric vehicle (hereinafter referred to as "HEV"). An engine EGN, a motor generator MG1, and a motor generator MG2 produce a torque for running the vehicle. Further, the motor generator MG1 and the motor generator MG2 have a function of not only producing a rotational torque but also converting the mechanical energy, which is added to the motor generator MG1 or the motor generator MG2 from the outside, into electrical power. The motor generator MG1 or MG2 is, for example, a synchronous machine or an induction machine. As described above, the motor generator MG1 or MG2 also acts as a motor or a power generator depending on the operation method.

The torque on the output side of the engine EGN and the output torque of the motor generator MG2 are transferred to the motor generator MG1 through a power transfer mechanism TSM. The rotational torque from the power transfer mechanism TSM, or the rotational torque produced by the motor generator MG1 is transferred to wheels through a transmission TM and a deferential gear DEF. On the other hand, in regenerative braking operation, the rotational torque is transferred from the wheels to the motor generator MG1. Then, the motor generator MG1 generates AC power based on the supplied rotational torque. The generated AC power is converted to DC power by the power conversion apparatus 200 as described below, to charge a high voltage battery 136. Then, the charged power is used as a traveling energy again. Further, when the power charged in the high voltage battery 136 runs low, it is possible to charge the battery 136 by converting the rotation energy generated by the engine EGN into AC power by the motor generator MG2, and by converting the AC power into DC power by the power conversion apparatus 200. The transfer of the mechanical energy from the engine EGN to the motor generator MG2 is performed by the power transfer mechanism TSM.

Next, the power conversion apparatus 200 will be described. An inverter circuit 140 and an inverter circuit 142 are electrically coupled through the battery 136 and a DC connector 138. The power is mutually transferred between the battery 136 and the inverter circuit 140 or 142. When the motor generator MG1 is operated as a motor, the inverter circuit 140 generates AC power based on the DC power supplied from the battery 136 through the DC connector 138. Then, the inverter circuit 140 supplies the AC power to the motor generator MG1 through an AC connector 188. The structure of the motor generator MG1 and the inverter circuit 140 acts as a first motor generator unit. Similarly, when the motor generator MG2 is operated as a motor, the inverter circuit 142 generates AC power based on the DC power supplied from the battery 136 through the DC connector 138. Then, the inverter circuit 142 supplies the AC power to the motor generator MG2 through an AC terminal 159. The structure of the motor generator MG2 and the inverter circuit 142 acts as a second motor generator unit. Both the first motor generator unit and the second motor generator unit are operated as motors or generators, or they are operated differently depending on the operation state. Further, it is also possible that one of the first and second motor generator units is not operated and is stopped.

Note that in the present embodiment, it is possible to drive the vehicle only by the power of the motor generator MG1 by allowing the first motor generator unit to operate as an electrical operation unit by the power of the battery 136. Further, in the present embodiment, the first motor generator unit or the second motor generator unit is allowed to act as a power generation unit by the power of the engine EGN or the power from the wheels, to generate power and thus the battery 136 can be charged.

The battery 136 is also used as a power supply for driving an auxiliary motor 195. Examples of the auxiliary motor are a motor for driving a compressor of an air conditioner, or a motor for driving a hydraulic pump for cooling. The DC power is supplied from the battery 136 to an auxiliary power module 350. Then, AC power is generated by the auxiliary power module 350 and is supplied to the auxiliary motor 195 through an AC terminal 120. Basically, the auxiliary power module 350 has the same circuit structure and function as the inverter circuits 140 and 142. The auxiliary power module 350 controls the phase, frequency, and power of the alternating current to be supplied to the auxiliary motor 195. The capacity of the auxiliary motor 195 is smaller than the capacity of the motor generators MG1 and MG2, so that the maximum conversion power of the auxiliary power module 350 is smaller than that of the respective inverter circuits 140 and 142. However, the basic structure of the auxiliary power module 350 and the basic operation thereof are substantially the same as those of the inverter circuits 140 and 142 as described above. Note that the power conversion apparatus 200 includes a capacitor module 500 for smoothing the DC power to be supplied to the inverter circuit 140, the inverter circuit 142, and an inverter circuit 350B.

The power conversion apparatus 200 includes a communication connector 21 for receiving an instruction from the upper control device, or for transmitting data showing the state to the upper control device. Based on the instruction from the connector 21, the power conversion apparatus 200 calculates the amount of control of the motor generator MG1, the motor generator MG2, and the auxiliary motor 195. Further, the power conversion apparatus 200 calculates whether to operate as a motor or a generator. Then, the power conversion apparatus 200 generates a control pulse based on the calculation result, and supplies the control pulse to a driver circuit 174 as well as a driver circuit 350A of the auxiliary power module 350. The auxiliary power module 350 may have a dedicated control circuit. In this case, the dedicated control circuit generates a control pulse based on the instruction from the connector 21, and supplies the control pulse to the driver circuit 350A of the auxiliary power module 350.

Based on the control pulse, the driver circuit 174 generates a drive pulse for controlling the inverter circuit 140 and the inverter circuit 142. Further, the diver circuit 350A generates a control pulse for driving the inverter circuit 350B of the auxiliary power module 350.

Next, the structure of the electric circuit of the inverter circuit 140 and the inverter circuit 142 will be described with reference to FIG. 2. Also the circuit structure of the inverter circuit 350B of the auxiliary power module 350 shown in FIG. 1 is basically similar to the circuit structure of the inverter circuit 140. Thus, the detailed description of the circuit structure of the inverter circuit 350B is omitted in FIG. 2, and the inverter circuit 140 will be described as a typical example. However, the output power of the auxiliary power module 350 is small, so that a semiconductor chip that forms upper and lower arms of each phase described below, as well as a circuit connecting the particular chip are aggregated and placed in the auxiliary power module 350.

Further, the circuit structures and operations of the inverter circuit 140 and the inverter circuit 142 are very similar to each other. Thus, the inverter circuit 140 will be described as representative.

Note that an insulating gate bipolar transistor is used below as a semiconductor element, which is hereafter referred to as IGBT. The inverter circuit 140 includes an upper and lower arm series circuit 150 having an IGBT 328 and diode 156 acting as an upper arm, and an IGBT 330 and diode 166 acting as a lower arm. The upper and lower arm series circuit 150 is provided corresponding to each of the three phases, U phase, V phase, and W phase of the AC power to be output.

In the present embodiment, the three phases correspond to the respective phase windings of three phases of the armature winding of the motor generator MG1. In each of the upper and lower arm series circuits 150 of the three phases, AC current is output from an intermediate electrode 168 which is a midpoint part of the series circuit. The AC current is coupled to an AC bus bar 802 which is an AC power line to the motor generator MG1 as described below, through the AC terminal 159 or the AC connector 188.

A collector electrode 153 of the IGBT 328 of the upper arm is electrically coupled to a capacitor terminal 506 on the positive electrode side of the capacitor module 500 through a positive electrode terminal 157. Then, an emitter electrode of the IGBT 330 of the lower arm is electrically coupled to a capacitor terminal 504 on the negative electrode side of the capacitor module 500 through a negative electrode terminal 158.

The IGBT 328 includes the collector electrode 153, a signal emitter electrode 155, and a gate electrode 154. Further, the IGBT 330 includes a collector electrode 163, a signal emitter electrode 165, and a gate electrode 164. The diode 156 is electrically coupled between the collector electrode 153 and the emitter electrode. Further, the diode 166 is electrically coupled between the collector electrode 163 and the emitter electrode. A metal-oxide-semiconductor field-effect transistor (hereinafter referred to as MOSFET) maybe used as a switching power semiconductor element. In this case, the diode 156 and the diode 166 may not be necessary. As the switching power semiconductor element, IGBT is suitable for the case where the DC voltage is relatively high, and MOSFET is suitable for the case where the DC voltage is relatively low.

The capacitor module 500 includes multiple capacitor terminals 506 on the positive electrode side, multiple capacitor terminals 504 on the negative electrode side, a battery positive terminal 509, and a battery negative terminal 508. A high-voltage DC power from the battery 136 is supplied to the battery positive terminal 509 and the battery negative terminal 508 through the DC connector 138. Then, the high-voltage DC power is supplied from the multiple capacitor terminals 506 on the positive electrode side of the capacitor module 500 and multiple capacitor terminals 504 on the negative electrode side of the capacitor module 500, to the inverter circuit 140, the inverter circuit 142, and the auxiliary power module 350. On the other hand, the DC power that is converted from the AC power by the inverter circuit 140 and the inverter circuit 142 is supplied to the capacitor module 500 from the capacitor terminal 506 on the positive electrode side and the capacitor terminal 504 on the negative electrode side. Then, the DC power is supplied to the battery 136 from the battery positive terminal 509 and the battery negative terminal 508 through the DC connector 138, and is accumulated in the battery 136.

A control circuit 172 includes a microcomputer (hereinafter referred to as "Micon") for performing arithmetic processing of the switching timing of the IGBT 328 and the IGBT 330. The information input to the Micon includes the target torque value required for the motor generator MG1, the current value supplied from the upper and lower arm series circuit 150 to the motor generator MG1, and the magnetic pole position of the rotor of the motor generator MG1. The target torque value is based on an instruction signal output from the upper control device not shown. The current value is detected based on a detection signal from a current sensor 180. The magnetic pole position is detected based on a detection signal output from a rotary magnetic pole sensor (not shown) such as a resolver provided in the motor generator MG1. In the present embodiment, it is assumed that the current sensor 180 detects current values of three phases. However, it is also possible to detect the current values of two phases and obtain the current of three phases by calculation.

FIG. 3 is an exploded perspective view of the power conversion apparatus 200 as an embodiment according to the present invention. The power conversion apparatus 200 includes a flow path forming body 12 that functions as a case for housing power semiconductor modules 300a to 300c and power semiconductor modules 301a to 301c described below, as well as the capacitor module 500. Further, the power conversion apparatus 200 also includes the lid 8. Note that it is also possible to have a structure in which a case body is provided separately from the flow path forming body 12 of the present embodiment, and the flow path forming body 12 is housed in the case.

The lid 8 houses the circuit component of the power conversion apparatus 200 and is fixed to the flow path forming body 12. The control circuit board 20 on which the control circuit 172 is mounted is placed in the inner upper portion of the lid 8. A first opening 202, a third opening 204a, a fourth opening 204b, and a fifth opening 205 are provided on the upper surface of the lid 8. Further, a second opening 203 is provided on the side wall of the lid 8.

The connector 21 is provided in the control circuit board 20, protruding to the outside through the first opening 202. The negative side power line 510 and the positive side power line 512 electrically couple the DC connector 138 to the capacitor module 500 and the like, and protrude to the outside through the second opening 203.

AC-side relay conductors 802a to 802c are connected to the power semiconductor modules 300a to 300c, respectively, and protrude to the outside through the third opening 204a. AC-side relay conductors 802d to 802f are connected to the power semiconductor modules 301a to 301c, respectively, and protrude to the outside through the fourth opening 204b. The AC output terminal of the auxiliary power module 350, not shown, protrudes to the outside through the fifth opening 205.

The direction of the fitting surface of the terminal of the connector 21, and the like, varies depending on the type of vehicle. In particular, when it is desired to mount on a small vehicle, it is preferable to allow the terminal to protrude outwardly with the fitting surface upward, in terms of the limitations in size of the engine room as well as the ease of assembly. For example, when the power conversion apparatus 200 is provided above the transmission TM, the workability is improved by allowing the terminal to protrude to the side opposite to the side on which the transmission TM is provided.

Figure 4:
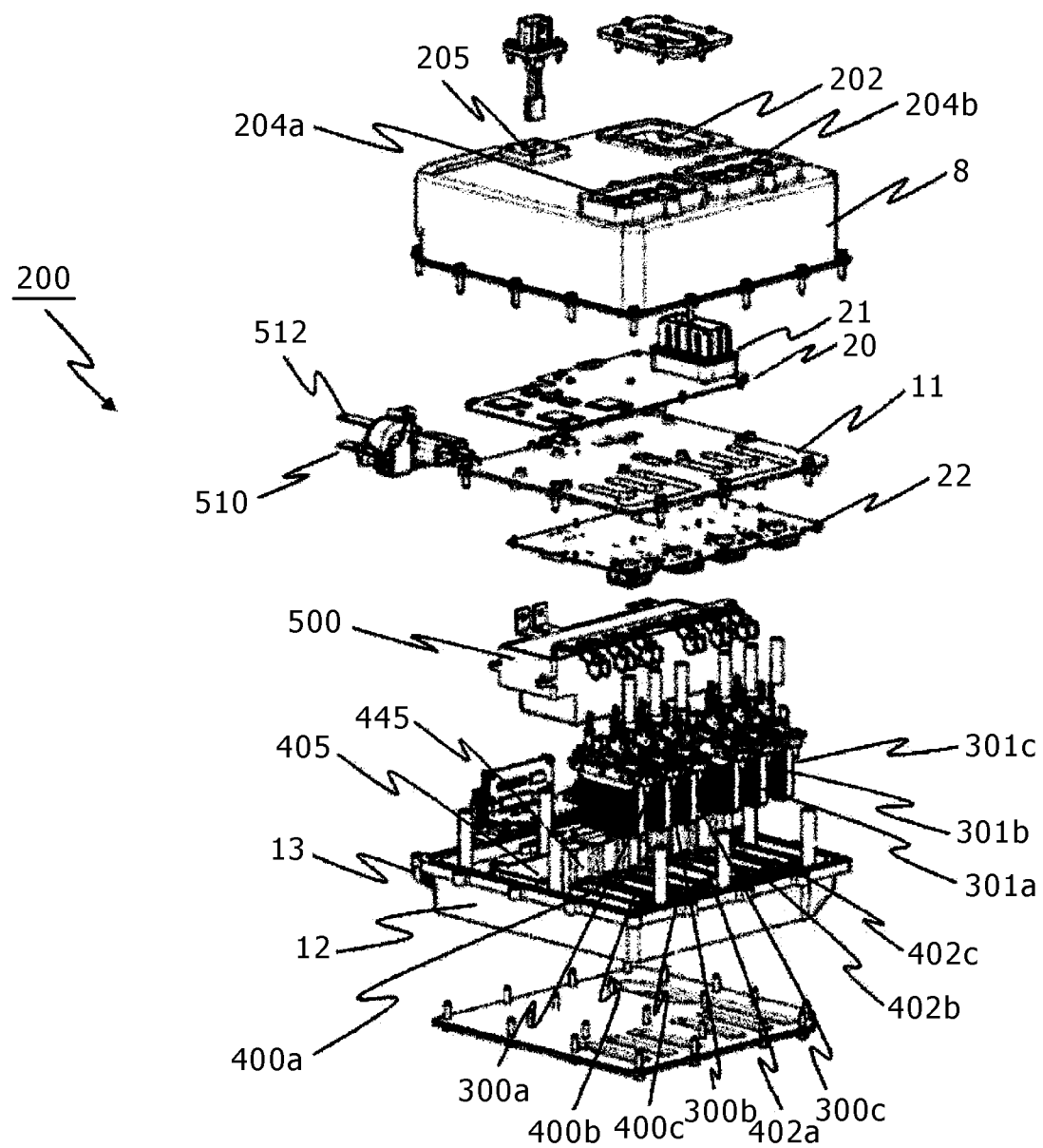
FIG. 4 is a perspective view of the power conversion apparatus disassembled into components to show the overall structure.

FIG. 4 is an overall exploded perspective view that helps to understand the structure housed in the flow path forming body 12 of the power conversion apparatus 200.

The flow path forming body 12 forms opening parts 400a to 400c and opening parts 402a to 402c that lead to the flow path through which a cooling refrigerant flows. The opening parts 400a to 400c are filled with the inserted power semiconductor modules 300a to 300c. Further, openings 402d to 402f are filled with the inserted power semiconductor modules 301a to 301c.

In the flow path forming body 12, a housing space 405 for housing the capacitor module 500 is formed on the side of the space in which the power semiconductor modules 300a to 300c and the power semiconductor modules 301a to 301c are housed.

The capacitor module 500 has a substantially constant distance from the power semiconductor modules 300a to 300c and from the power semiconductor modules 301a to 301c, so that the circuit constant can easily be balanced between the smoothing capacitor and the power semiconductor module circuit in each of the three phases. Thus, it is possible to achieve a circuit structure in which the spike voltage can easily be reduced.

By integrally forming the main structure of the flow path of the flow path forming body 12 with the flow path forming body 12 by casting an aluminum material, it is possible to increase the mechanical strength of the flow path, in addition to obtaining the cooling effect. Further, the flow path forming body 12 and the flow path are formed into an integral structure by aluminum casting, so that the heat transfer is increased and the cooling efficiency is improved. Note that the power semiconductor modules 300a to 300c and the power semiconductor modules 301a to 301c are fixed to the flow path to complete the flow path. Then, a water leakage test is performed on the water path. Once the water path passes the water leakage test, it is allowed to perform the operation of mounting the capacitor module 500, the auxiliary power module 350, and the substrate. As described above, the flow path forming body 12 is provided on the bottom of the power conversion apparatus 200, and then the necessary components such as the capacitor module 500, the auxiliary power module 350, and the substrate are fixed sequentially from the top. Thus, the productivity and reliability are increased.

The driver circuit board 22 is provided above the power semiconductor modules 300a to 300c, the power semiconductor modules 301a to 301c, and the capacitor module 500. Further, the metal base plate 11 is provided between the driver circuit board 22 and the control circuit board 20. The metal base plate 11 has the function of the electromagnetic shield of the circuit group mounted on the driver circuit board 22 and the control circuit board 20, and at the same time has the capacity to release heat generated by the driver circuit board 22 and the control circuit board 20 to cool down.

Further, the metal base plate 11 acts to increase the mechanical resonant frequency of the control circuit board 20. In other words, the screw parts for fixing the control circuit board 20 to the metal base 11 can be provided at short intervals. As a result, the distance between the supporting points can be reduced when mechanical vibration occurs, so that the resonant frequency can be increased. For example, the resonant frequency of the control circuit board 20 can be increased with respect to the vibration frequency transferred from the transmission, so that the control circuit board 20 is unlikely to be affected by the vibration and the reliability is increased.

Figure 5:
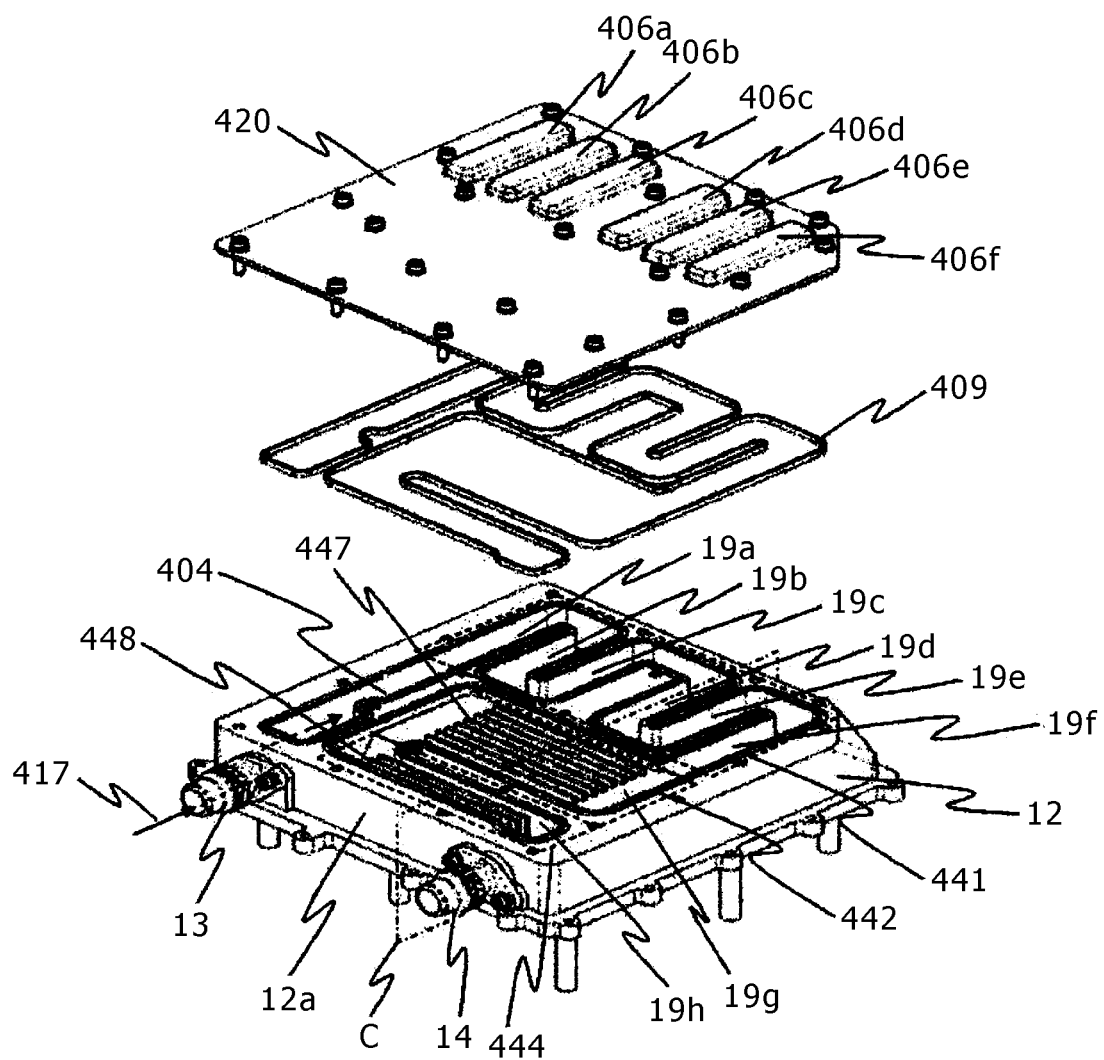
FIG. 5 is a view seen from the bottom side of the flow path forming body 12 shown in FIG. 4 to show the flow path forming body 12.

FIG. 5 is a view for illustrating the flow path forming body 12, which is seen from the bottom of the flow path forming body 12 shown in FIG. 4.

In the flow path forming body 12, an inlet pipe 13 and an outlet pipe 14 are provided on one side wall 12a. The cooling refrigerant flows in the direction of a flow direction 417 indicated by the dotted line, and flows to a first flow path part 19a formed along one side of the flow path forming body 12, through the inlet pipe 13. A second flow path part 19b is connected to the first flow path portion 19a through a return flow path part, and is formed parallel to the first flow path part 19a. A third flow path part 19c is connected to the second flow path part 19b through a return flow path part, and is formed parallel to the second flow path part 19b. A fourth flow path part 19d is connected to the third flow path part 19c through a return flow path part, and is formed parallel to the third flow path part 19c. A fifth flow path part 19e is connected to the fourth flow path part 19d through a return flow path part, and is formed parallel to the fourth flow path part 19d. A sixth flow path part 19f is connected to the fifth flow path part 19e through a return flow path part, and is formed parallel to the fifth flow path part 19e. In other words, the first to sixth flow path parts 19e to 19f are connected to form a meander flow path.

A first flow path forming body 441 forms the first flow path part 19a, the second flow path part 19b, the third flow path part 19c, the fourth flow path part 19d, the fifth flow path part 19e, and the sixth flow path part 19f. The first flow path part 19a, the second flow path part 19b, the third flow path part 19c, the fourth flow path part 19d, the fifth flow path part 19e, and the sixth flow path part 19f are formed larger in the depth direction than in the width direction, respectively.

The seventh flow path part 19g leads to the sixth flow path part 19f, and is formed at a position facing the housing space 405 of the capacitor module 500 shown in FIG. 4. A second flow path forming body 442 forms the seventh flow path part 19g. The seventh flow path part 19g is formed larger in the width direction than in the depth direction.

An eighth flow path part 19h leads to the seventh flow path part 19g, and is formed at a position facing the auxiliary power module 350 described below. Further, the eighth flow path part 19h is connected to the outlet pipe 14. A third flow path forming body 444 forms the eighth flow path part 19h. The eighth flow path part 19h is formed larger in the depth direction than in the width direction.

An opening portion 404 to which all the flow path parts lead as described above is formed on the lower surface of the flow path forming body 12. The opening portion 404 is closed by a lower cover 420. A seal member 409 is provided between the lower cover 420 and the flow path forming body 12 to keep air tightness.

Further, protruding portions 406a to 406f protruding to the direction away from the flow path forming body 12 are formed in the lower cover 420. The protruding portions 406a to 406f are provided corresponding to the power semiconductor modules 300a to 300c and the power semiconductor modules 301a to 301c. In other words, the protruding portion 406a is formed facing the first flow path part 19a. The protruding portion 406b is formed facing the second flow path part 19b. The protruding portion 406c is formed facing the third flow path part 19c. The protruding portion 406d is formed facing the forth flow path part 19d. The protruding portion 406e is formed facing the fifth flow path part 19e. The protruding portion 406f is formed facing the sixth flow path part 19f.

The depth and width of the seventh flow path part 19g greatly vary from the depth and width of the sixth flow path part 19f. In order to be able to rectify the flow of the cooling refrigerant and to manage the flow rate in the significant change in the shape of the flow path, it is desirable that the second flow path forming body 442 is provided with a straight fin 447 protruding to the seventh flow path part 19g.

Similarly, the depth and width of the eighth flow path part 19h greatly vary from the depth and width of the seventh flow path part 19g. In order to be able to rectify the flow of the cooling refrigerant and to manage the flow rate in the significant change in the shape of the flow path, it is desirable that the third flow path forming body 444 is provided with a straight fin 448 protruding to the eighth flow path part 19h.

The detailed structure of the power semiconductor modules 300a to 300c used in the inverter circuit 140 will be described with reference to FIGS. 6 to 10. The power semiconductor modules 300a to 300c have the same structure, so that the structure of the power semiconductor module 300a will be described as representative. Note that in FIGS. 6 to 10, a signal terminal 325U corresponds to the gate electrode 154 and signal emitter electrode 155 disclosed in FIG. 2, and a signal terminal 325L corresponds to the gate electrode 164 and emitter electrode 165 disclosed in FIG. 2. Further, a DC positive electrode terminal 315B is the same as the positive electrode terminal 157 disclosed in FIG. 2, and a DC negative electrode terminal 319B is the same as the negative electrode terminal 158 disclosed in FIG. 2. Further, an AC terminal 320B is the same as the AC terminal 159 disclosed in FIG. 2.

FIG. 6(a) is a perspective view of the power semiconductor module 300a of the present embodiment. FIG. 6(b) is a cross-sectional view taken along the cross section D of the power semiconductor module 300a of the present embodiment, as viewed from the direction E.

Figure 6:
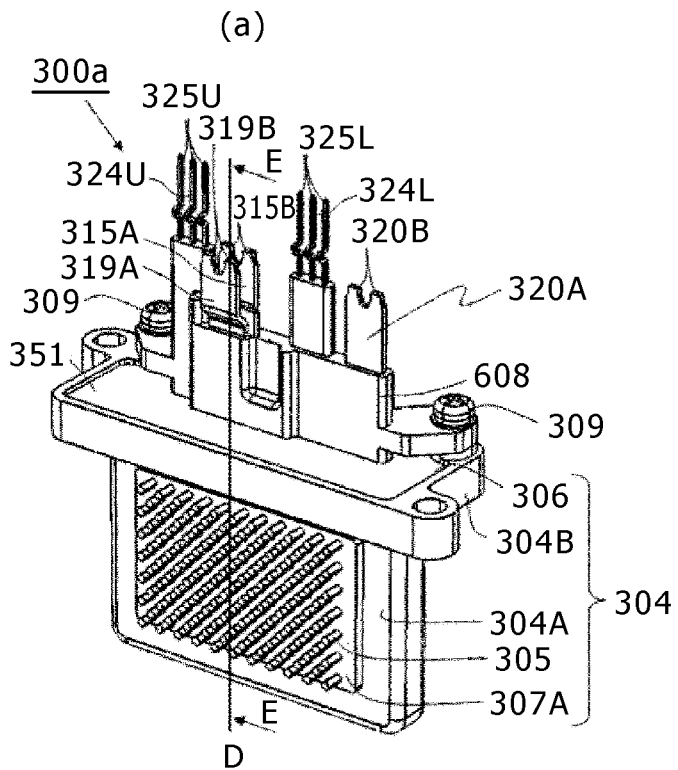
Figure 6:
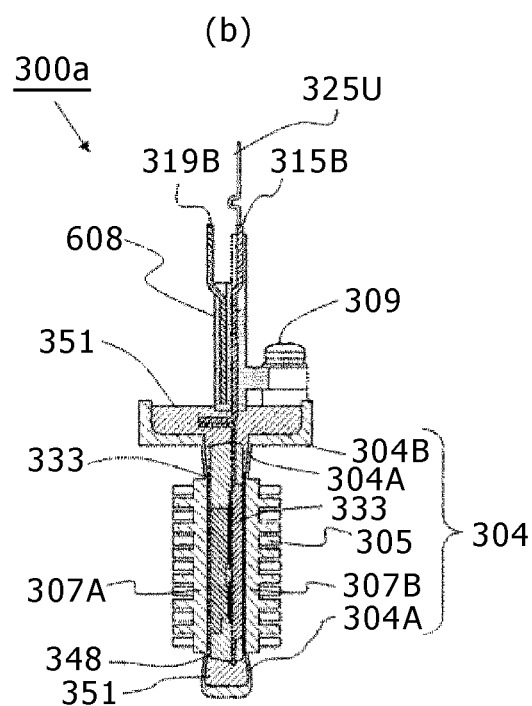
Figure 7:
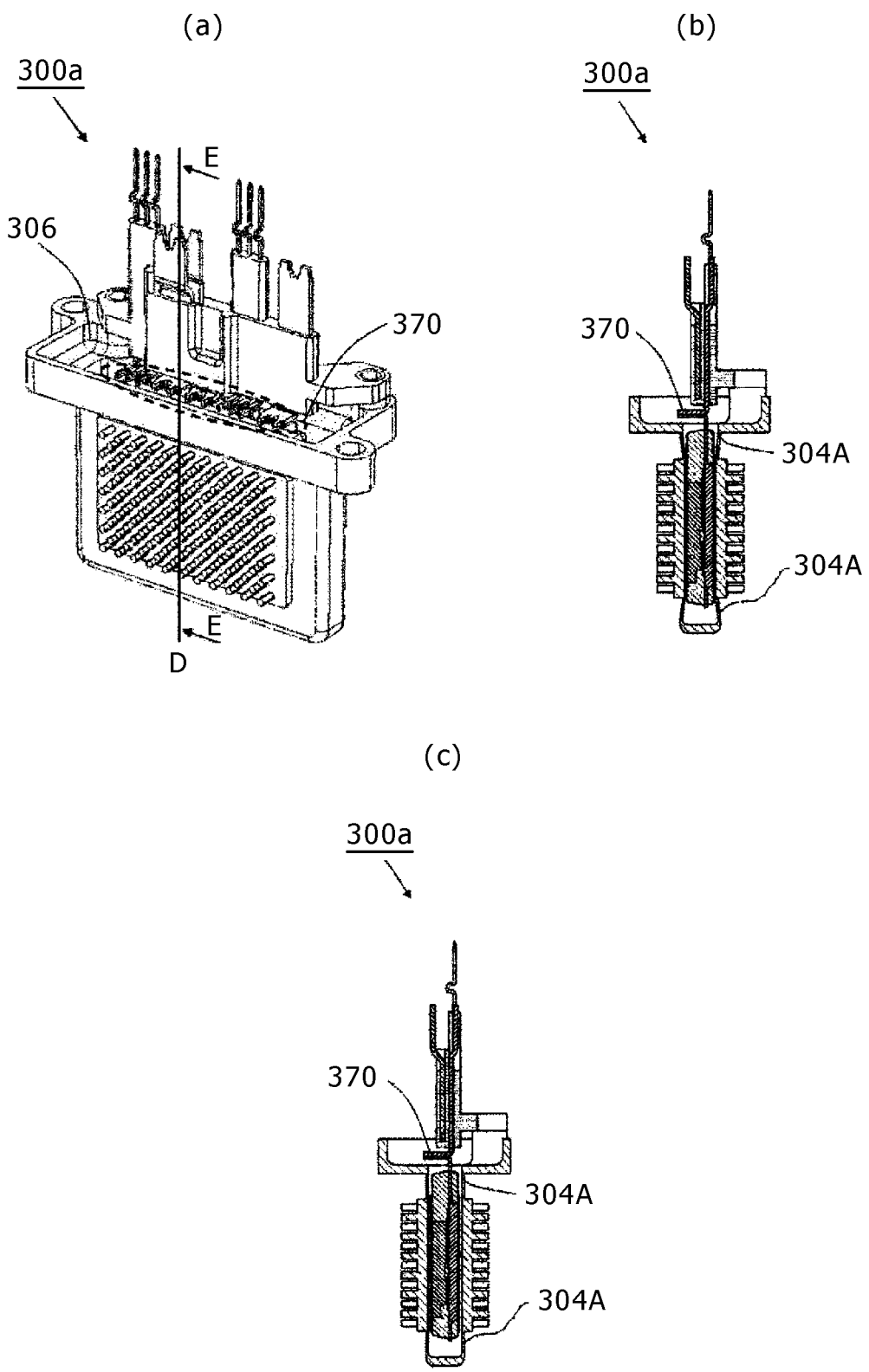
FIG. 7(a) is a perspective view, 7(b) is a cross-sectional view similar to FIG. 6(b) taken along the cross section D as viewed from the direction E.
FIG. 7(c) is a cross-sectional view of a thin wall portion 304A before deformed due to a pressure applied to a fin 305.

FIG. 7 is a view showing the power semiconductor module 300a, in which a screw 309 and a second sealing resin 351 are removed from the state shown in FIG. 6 to help understanding. FIG. 7(a) is a perspective view, and FIG. 7(b) is a cross-sectional view similar to FIG. 6(b) taken along the cross section D as viewed from the direction E. Further, FIG. 7(c) is a cross-sectional view of a thin wall portion 304A before deformed due to a pressure applied to the fin 305.

Figure 8:
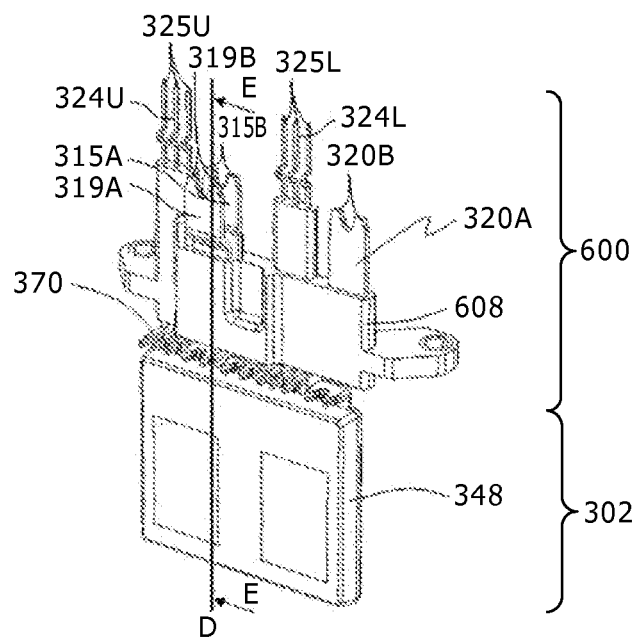
Figure 8:
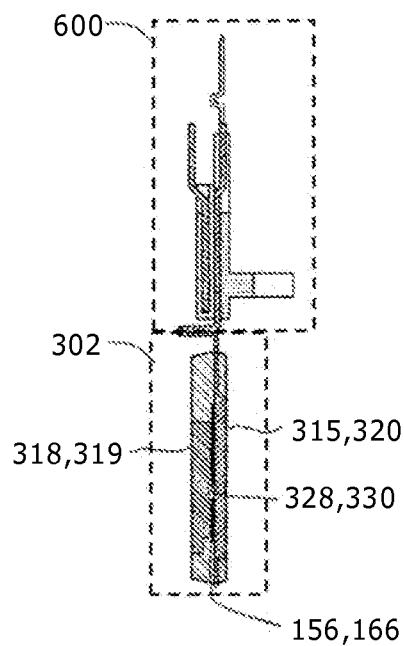

FIG. 8 is a view of the power semiconductor module 300a, in which the module case 304 is further removed from the state shown in FIG. 7. FIG. 8(a) is a perspective view, and FIG. 8(b) is a cross-sectional view similar to FIGS. 6(b) and 7(b) taken along the cross section D as viewed from the direction E.

Figure 9:
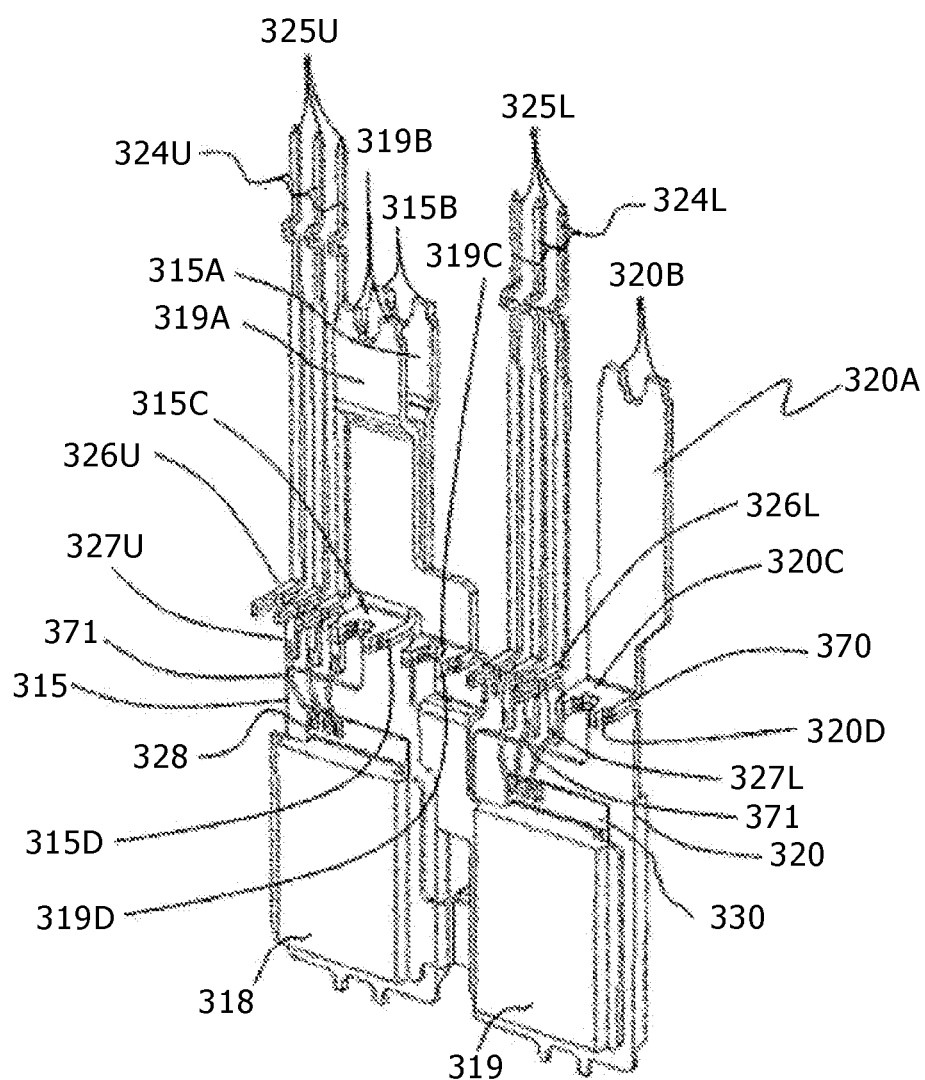
FIG. 9 is a perspective view of the power semiconductor module 300a with a first sealing resin 348 and a wiring insulating portion 608 being further removed from the state shown in FIG. 8.

FIG. 9 is a perspective view of the power semiconductor module 300a, in which the first sealing resin 348 and the wiring insulating portion 608 are further removed from the state shown in FIG. 8.

Figure 10:
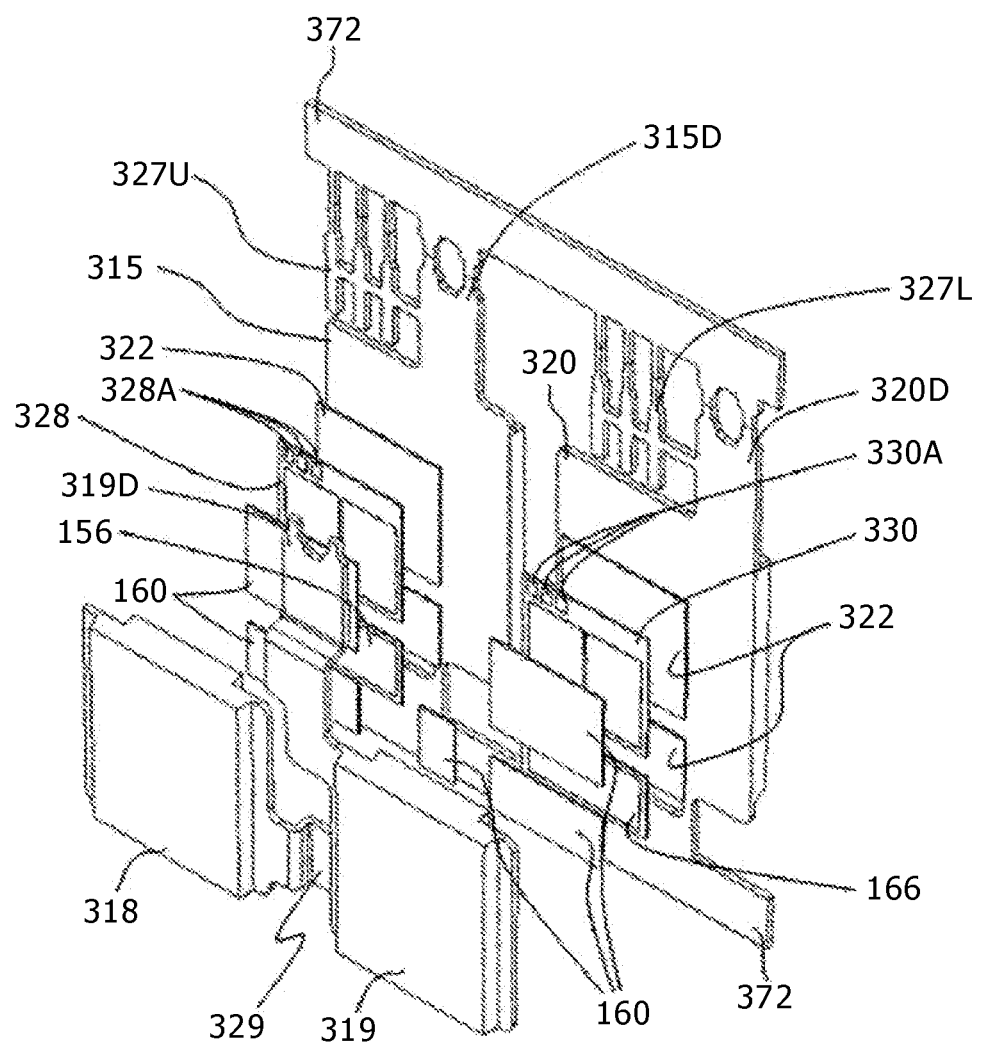
FIG. 10 is a view for illustrating the assembly process of a module primary sealant 302.

FIG. 10 is a view for illustrating the assembly process of the module primary sealant 302. The power semiconductor elements (the IGBT 328, IGBT 330, diode 156, and diode 166) forming the upper and lower arm series circuit 150 are fixed so as to be sandwiched between a conductor plate 315 and a conductor plate 318 or between a conductor plate 320 and a conductor plate 319 as shown in FIGS. 8 and 9. The conductor plate 315 and the like are sealed by the first sealing resin 348 with the radiating surface being exposed, and an insulation member 333 is thermally compressed to the radiating surface. The first sealing resin 348 has a polyhedron shape (substantially rectangular parallelepiped shape in this case) as shown in FIG. 8.

The module primary sealant 302 sealed by the first sealing resin 348 is inserted into the module case 304, and is thermally compressed to the inner surface of the module case 304, which is a CAN-type cooler, with the insulation member 333 therebetween. Here, the CAN-type cooler is a cooler of a cylindrical shape with an insertion opening 306 on one surface and with a bottom on the other side. A void remaining in the interior of the module case 304 is filled with the second sealing resin 351.

The module case 304 is formed of a member having an electrical conductivity, for example, an aluminum alloy material (Al, AlSi, AlSiC, Al—C, and the like). The outer periphery of the insertion opening 306 is surrounded by a flange 304B. Further, as shown in FIG. 6(a), a first radiating surface 307A and a second radiating surface 307B, each having an area greater than that of the other surfaces, are provided facing each other. Then, the respective power semiconductor elements (IGBT 328, IGBT 330, diode 156, and diode 166) are arranged so as to face the respective radiating surfaces.

The three surfaces connecting to the opposing first and second radiating surfaces 307A and 307B form a plane that is sealed at a width smaller than the first and second radiating surfaces 307A and 307B. Then, the insertion opening 306 is formed on the plane of the one remaining side. The module case 304 does not necessarily have an exact rectangular shape, and may have rounded corners as shown FIG. 6(a).

By using the case of metal having such a shape, it is possible to ensure the seal for the refrigerant in the flange 304B, even if the module case 304 is inserted into the flow path through which the refrigerant such as water or oil flows. Thus, it is possible to prevent the cooling refrigerant from entering the interior of the module case 304 by a simple structure. Further, the fins 305 are uniformly formed in the opposing first and second radiating surfaces 307A and 307B, respectively. Further, the thin wall portion 304A whose thickness is extremely thin is formed in the outer periphery of the first radiating surface 307A and the second radiating surface 307B. The thickness of the thin wall portion 304A is significantly reduced to the extent that it is easily deformed due to a pressure applied to the fin 305, so that the productivity after the insertion of the module primary sealant 302 is increased.

As described above, by thermally compressing the conductor plate 315 and the like to the inner wall of the module case 304 through the insulation member 333, it is possible to reduce the void between the conductor plate 315 and the like, and the inner wall of the module case 304. Thus, the heat generated by the power semiconductor element can be transferred to the fin 305 effectively. Further, by allowing the insulation member 333 to have a certain thickness and flexibility, it is possible to absorb the generation of thermal stress by the insulation member 333, which is better to be used in the power conversion apparatus for the vehicle in which the temperature change is significant.

A DC positive electrode wiring 315A and a DC negative electrode wiring 319A, which are formed of metal, are provided on the outside of the module case 304 to electrically couple to the capacitor module 500. A DC positive electrode terminal 315B and a DC negative electrode terminal 319B are formed at the tip portion of the DC positive electrode 315A and at the tip portion of the DC negative electrode wiring 319A, respectively. Further, an AC wiring 320A of metal is provided to supply AC power to the motor generator MG1 or MG2. Then, an AC terminal 320B is formed at the tip portion of the AC electrode wiring 320A. In the present embodiment, as shown in FIG. 9, the DC positive electrode wiring 315A is connected to the conductor plate 315, the DC negative electrode wiring 319A is connected to the conductor plate 319, and the AC wiring 320A is connected to the conductor plate 320.

Signal wirings 324U and 324L of metal are also provided on the outside of the module case 304 to electrically couple to the driver circuit 174. Then, a signal terminal 325U and a signal terminal 325L are formed at the tip portion of the signal wiring 324U and at the tip portion of the signal wiring 324L, respectively. In the present embodiment, as shown in FIG. 9, the signal wiring 324U is connected to the IGBT 328 and the signal wiring 324L is connected to the IGBT 330.

The DC positive electrode wiring 315A, the DC negative electrode wiring 319A, the AC wiring 320A, the signal wiring 324U, and the signal wiring 324L are integrally formed as an auxiliary mold body 600, in such a way that they are insulated from each other by the wiring insulating portion 608 formed by a resin material. The wiring insulating portion 608 also acts as a support member for supporting each wiring. A thermosetting or thermoplastic resin with insulation properties is suitable for the resin material used for the wiring insulating portion 608. In this way, it is possible to ensure insulation between each of the DC positive electrode wiring 315A, the DC negative electrode wiring 319A, the AC wiring 320A, the signal wiring 324U, and the signal wiring 324L. As a result, high density wiring can be achieved.

The auxiliary module body 600 is bonded with a metal in the module primary sealant 302 and a connection part 370. Then, the auxiliary module body 600 is fixed to the module case 304 by the screw 309 passing through a screw hole provided in the wiring insulating portion 608. For example, TIG welding can be used in the metal bonding of the module primary sealant 302 and the auxiliary mold body 600 in the connection part 370.

The DC positive electrode wiring 315A and the DC negative electrode wiring 319A are laminated face to face with the wiring insulating portion 608 interposed therebetween, and are of a shape extending substantially parallel to each other. Because of the arrangement and shape described above, the current that instantaneously flows in the switching operation of the power semiconductor element is oppositely oriented and flows in the opposite direction. In this way, the magnetic fields generated by the current act to cancel each other out, so that low inductance can be achieved by this action. Note that the AC wiring 320A and the signal terminals 325U and 325L also extend in the same direction as the direction of the DC positive electrode wiring 315A and the DC negative electrode wiring 319A.

The connection part 370 in which the module primary sealant 302 and the auxiliary mold body 600 are bonded with a metal is sealed within the module case 304 by the second sealing resin 351. In this way, it is possible to stably ensure the required insulation distance between the connection part 370 and the module case 304. Thus, the reduction in size of the power semiconductor module 300a can be achieved as compared to the case where the connection part 370 is not sealed.

As shown in FIG. 9, an auxiliary module-side DC positive electrode connection terminal 315C, an auxiliary module-side DC negative electrode connection terminal 319C, an auxiliary module-side AC connection terminal 320C, an auxiliary module-side signal connection terminal 326U, and an auxiliary module-side signal connection terminal 326L are arranged in a line in the connection part 370 on the side of the auxiliary mold body 600. On the other hand, an element-side DC positive electrode connection terminal 315D, an element-side DC negative electrode connection terminal 319D, an element-side AC connection terminal 320D, an element-side signal connection terminal 327U, and an element-side signal connection terminal 327L are arranged in a line along one surface of the first sealing resin 348 having a polyhedron shape, in the connection part 370 on the side of the module primary sealant 302. By configuring the connection part 370 in which the respective terminals are arranged in a line, it is easy to produce the module primary sealant 302 by transfer molding.

Here, the positional relationship between the respective terminals will be described, in which the portion extending outward from the first sealing resin 348 of the module primary sealant 302 is viewed as a terminal for each type. In the following description, the terminal formed by the DC positive electrode wiring 315A (including the DC positive electrode terminal 315B and the auxiliary module-side DC positive electrode connection terminal 315C) and the element-side DC positive electrode terminal 315D is referred to as the positive terminal. Further, the terminal formed by the DC negative electrode wiring 319A (including the DC negative electrode terminal 319B and the auxiliary module-side DC negative electrode connection terminal 319C) and the element-side DC positive electrode connection terminal 315D is referred to as the negative terminal. The terminal formed by the AC wiring 320A (including the AC terminal 320B and the auxiliary module-side AC connection terminal 320C) and the element-side AC connection terminal 320D is referred to as the output terminal. The terminal formed by the signal wiring 324U (including the signal terminal 325U and the auxiliary module-side signal connection terminal 326U) and the element-side signal connection terminal 327U is referred to as the upper arm signal terminal. Then, the terminal formed by the signal wiring 324L (including the signal terminal 325L and the auxiliary module-side signal connection terminal 326L) and the element-side signal connection terminal 327L is referred to as the lower arm signal terminal.

Each of the terminals protrudes from the first sealing resin 348 and the second sealing resin 351 through the connection part 370. The protruding portions protruding from the first sealing resin 348 (the element-side DC positive electrode connecting terminal 315D, the element-side DC negative electrode connection terminal 319D, the element-side AC connection terminal 320D, the element-side signal connection terminal 327U, and the element-side signal connection terminal 327L) are arranged in a line along one surface of the first sealing resin 348 having a polyhedron shape as described above. Further, the positive terminal and the negative terminal protrude from the second sealing resin 351 in a laminated state, extending to the outside of the module case 304. Because of this structure, it is possible to prevent excessive stress on the connection part of the power semiconductor element and the particular terminal, and to prevent the gap from being generated in the mold, at the time of mold clamping for producing the module primary sealant 302 by sealing the power semiconductor element by the first sealing resin 348. Further, the opposing currents flowing through each of the laminated positive and negative terminals generate magnetic fluxes in the opposite directions to cancel each other out. As a result, low inductance can be achieved.

On the side of the auxiliary module body 600, the auxiliary module-side DC positive electrode connection terminal 315C and the auxiliary module-side DC negative electrode connection terminal 319C are formed at the tip portions of the DC positive electrode wiring 315A and the DC negative electrode wiring 319A on the opposite side of the DC positive electrode terminal 315B and the DC negative electrode terminal 319B, respectively. Further, the auxiliary module-side AC connection terminal 320C is formed at the tip portion of the AC wiring 320A on the opposite side of the AC terminal 320B. The auxiliary module-side signal connection terminals 326U, 326L are formed at the tip portions of the signal wirings 324U, 324L on the opposite side of the signal terminals 325U, 325L, respectively.

On the other hand, on the side of the module primary sealant 302, the element-side DC positive electrode connection terminal 315D, the element-side DC negative electrode connection terminal 319D, and the element-side AC connection terminal 320D are respectively formed in the conductor plates 315, 319, and 320. Further, the element-side signal connection terminals 327U, 327L are connected to the IGBTs 328, 330 by a bonding wire 371, respectively.

As shown in FIG. 10, the DC positive side conductor plate 315 and the AC output side conductor plate 320, as well as the element-side signal connection terminals 327U and 327L are connected to a common tie bar 372, and are integrally formed so as to be substantially in the same plane. A collector electrode of the IGBT 328 on the upper arm side and a cathode electrode of the diode 156 on the upper arm side are fixed to the conductor plate 315. A collector electrode of the IGBT 330 on the lower arm side and a cathode electrode of the diode 166 on the lower arm side are fixed to the conductor plate 320. The conductor plate 318 and the conductor plate 319 are arranged so as to be substantially in the same plane, on the IGBTs 328, 330 and the diodes 156, 166. An emitter electrode of the IGBT 328 on the upper arm side and an anode electrode of the diode 156 on the upper arm side are fixed to the conductor plate 318. An emitter electrode of the IGBT 330 on the lower arm side and an anode electrode of the diode 166 on the lower arm side are fixed to the conductor plate 319. Each of the power semiconductor elements is fixed to the element fixing part 322 provided in each conductor plate through the metal bonding material 160. Examples of the metal bonding material 160 area solder material, silver sheet, and a low-temperature sintering bonding material containing fine metal particles.

Each power semiconductor element has a flat plate-like structure, and the respective electrodes of the power semiconductor element are formed on the front and back surfaces. As shown in FIG. 10, each of the electrodes of the power semiconductor element is sandwiched between the conductor plate 315 and the conductor plate 318, or between the conductor plate 320 and the conductor plate 319. In other words, the conductor plate 315 and the conductor plate 318 are laminated face to face substantially in parallel to each other through the IGBT 328 and the diode 156. Similarly, the conductor plate 320 and the conductor plate 319 are laminated face to face substantially in parallel to each other through the IGBT 330 and the diode 166. Further, the conductor plate 320 and the conductor plate 318 are connected through an intermediate electrode 329. Because of this connection, the upper arm circuit and the lower arm circuit are electrically coupled to form the upper and lower arm series circuit. As described above, the IGBT 328 and the diode 156 are sandwiched between the conductor plate 315 and the conductor plate 318. At the same time, the IGBT 330 and the diode 166 are sandwiched between the conductor plate 320 and the conductor plate 319 to connect the conductor plate 320 and the conductor plate 318 through the intermediate electrode 329. Then, the control electrode 328A of the IGBT 328 and the element-side signal connection terminal 327U are connected by the bonding wire 371. At the same time, the control electrode 330A of the IGBT 330 and the element-side signal connection terminal 327L are connected by the bonding wire 317.

Figure 11:
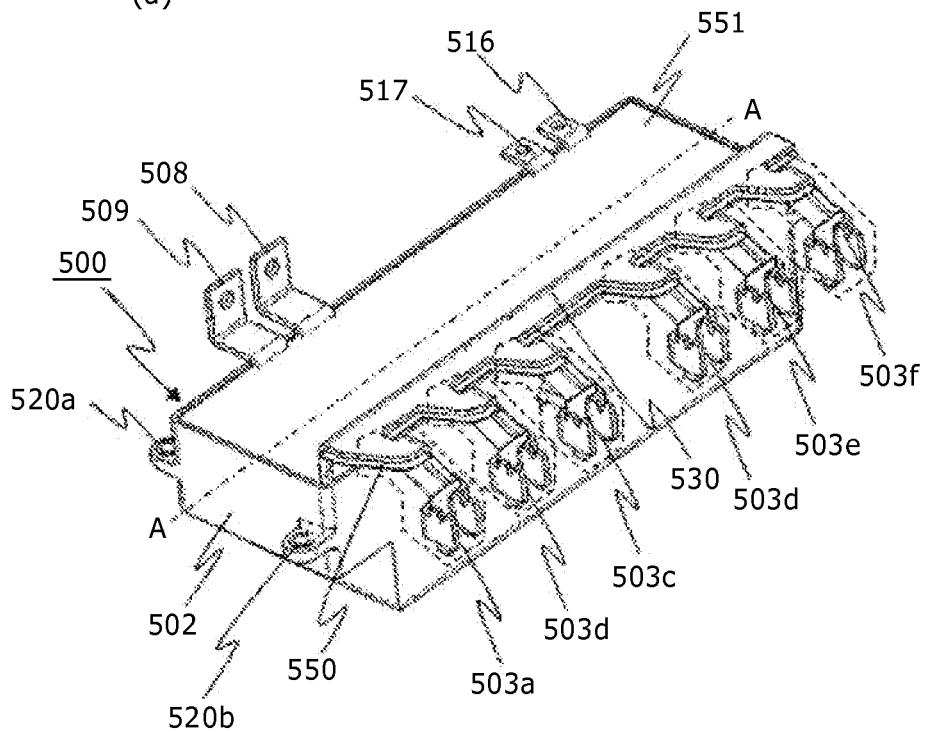
FIG. 11 (a) is a perspective view showing the external appearance of a capacitor module 500.
Figure 11:
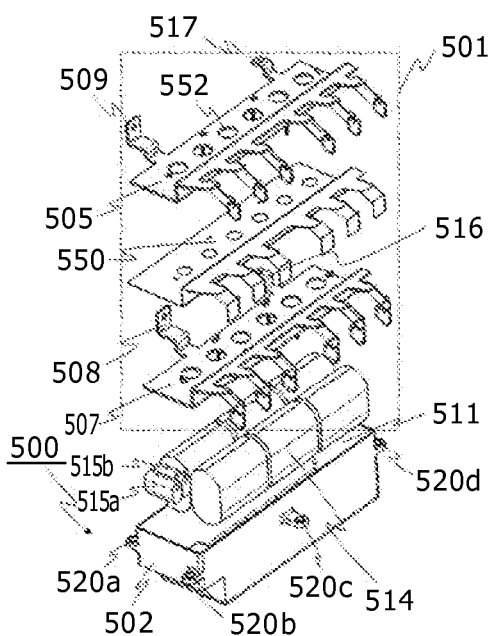

FIG. 11(a) is a perspective view showing the external appearance of the capacitor module 500. FIG. 11 (b) is an explode perspective view showing the internal structure of the capacitor module 500. A laminated conductor plate 501 is formed by a negative electrode conductor plate 505 and a positive electrode conductor plate 507 that are formed by a wide plate-like conductor, as well as an insulating sheet 550 sandwiched between the negative electrode conductor plate 505 and the positive electrode conductor 507. The laminated conductor plate 501 allows the magnetic fluxes to cancel each other out for the current flowing through the upper and lower arm series circuit 150 of each phase. Thus, low inductance can be achieved with respect to the current flowing through the upper and lower arm series circuit 150.

The battery negative terminal 508 and the battery positive terminal 509 are formed rising from one side in the longitudinal direction of the laminated conductor plate 501. The battery negative terminal 508 and the battery positive terminal 509 are connected to the positive electrode conductor plate 507 and the negative electrode conductor plate 505, respectively. The auxiliary capacitor terminals 516 and 517 are formed rising from one side in the longitudinal direction of the laminated conductor plate 501. The auxiliary capacitor terminals 516 and 517 are connected to the positive electrode conductor plate 507 and the negative electrode conductor plate 505, respectively.

The relay conductor part 530 is formed rising from one side in the longitudinal direction of the laminated conductor plate 501. The capacitor terminals 503a to 503c protrude from the tip portion of the relay conductor part 530. The capacitor terminals 503a to 503c are formed corresponding to the power semiconductor modules 300a to 300c, respectively. Further, capacitor terminals 503d to 503f also protrude from the tip portion of the relay conductor part 530. The capacitor terminals 503d to 503f are formed corresponding to the power semiconductor modules 301a to 301c, respectively. All of the relay conductor part 530 and the capacitor terminals 503a to 503c are configured in a laminated structure with the insulating sheet 550 interposed therebetween, in order to achieve low inductance of the current flowing through the upper and lower arm series circuit 150. Further, the relay conductor part 530 is configured such that the through holes and the like that may prevent the current flow are not formed or reduced as much as possible.

Because of this structure, the return current, which is generated in switching between the power semiconductor modules 300a to 300c provided for each phase, can easily flow to the relay conductor part 530 and is unlikely to flow to the side of the laminated conductor plate 501. Thus, it is possible to reduce the heat generated in the laminated conductor plate 501 due to the return current.

Note that in the present embodiment, the negative electrode conductor plate 505, the positive electrode conductor plate 507, the battery negative terminal 508, the battery positive terminal 509, the relay conductor part 530, and the capacitor terminals 503a to 503f are configured by an integrally formed metal plate, and have the effect of reducing the inductance of the current flowing through the upper and lower arm series circuit 150.

A plurality of the capacitor cells 514 are provided below the laminated conductor plate 501. In the present embodiment, three capacitor cells 514 are arranged in a line along one side in the longitudinal direction of the laminated conductor plate 501. Further, another three capacitor cells 514 are arranged in a line along the other side in the longitudinal direction of the laminated conductor plate 501. Thus, six capacitor cells are provided in total.

The capacitor cells 514, which are arranged along the respective sides in the longitudinal direction of the laminated conductor plate 501, are symmetrically arranged with respect to the dotted line A-A shown in FIG. 11(a). In this way, when the DC current smoothed by the capacitor cells 514 is supplied to the power semiconductor modules 300a to 300c and the power semiconductor modules 301a to 301c, the current balance between the capacitor terminals 503a to 503c and the capacitor terminals 503d to 503f is equalized, so that the inductance of the laminated conductor plate 501 can be reduced. Further, it is possible to prevent the current from flowing locally in the laminated conductor plate 501. Thus, the thermal balance is equalized and the heat resistance can be improved.

The capacitor cell 514 is a unit structure of the power storage part of the capacitor module 500, using a film capacitor in which two films with a metal such as aluminum deposited on one surface are laminated and wound to form two metal layers as positive and negative electrodes, respectively. The electrodes of the capacitor cell 514 are produced by spraying a conductor such as tin, in which the wound axial surfaces serve as the positive and negative electrodes, respectively.

The capacitor case 502 includes a housing part 511 for housing the capacitor cells 514. The housing part 511 has upper and lower surfaces each having a substantially rectangular shape. The capacitor case 502 includes holes 520a to 520d through which fixing means such as screws pass to fix the capacitor module 500 to the flow path forming body 12. The capacitor case 502 of the present invention is formed of resin with high thermal conductivity, but may be formed of metal or other materials.

Further, after the laminated conductor plate 501 and the capacitor cells 514 are housed in the capacitor case 502, a filling material 551 is filled in the capacitor case 502 so as to cover the laminated conductor plate 501, except the capacitor terminals 503a to 503f, the battery negative terminal 508, and the battery positive terminal 509.

Further, capacitor cell 514 generates heat by the electric resistance of the metal thin film deposited on the inner film as well as the inner conductor, by the ripple current in switching. Thus, in order to make it easy to release the heat of the capacitor cell 514 through the capacitor case 502, the capacitor cell 514 is molded with the filling material.

In addition, by using the filling material of resin, it is possible to improve the moisture resistance of the capacitor cell 514.

In the present embodiment, the seventh flow path part 19g is provided along the longitudinal direction of the housing part 511 of the capacitor module 500 (see FIG. 5), so that the cooling efficiency is increased.

Further, a noise filter capacitor cell 515a is connected to the positive electrode conductor plate 507 to remove a specific noise generated between the positive electrode and the ground. A noise filter capacitor cell 515b is connected to the negative electrode conductor plate 505 to remove a specific noise generated between the negative electrode and the ground. The capacity of the respective the noise filter capacitor cells 515a and 515b is set smaller than the capacity of the capacitor cell 514. Further, the noise filter capacitor cells 515a and 515b are placed closer to the battery negative terminal 508 and the battery positive terminal 509 than the capacitor terminals 503a to 503f are placed. In this way, it is possible to remove early a specific noise that is mixed into the battery negative terminal 508 and the battery positive-side terminal 509. As a result, it is possible to reduce the influence of the noise on the power semiconductor module.

Figure 12:
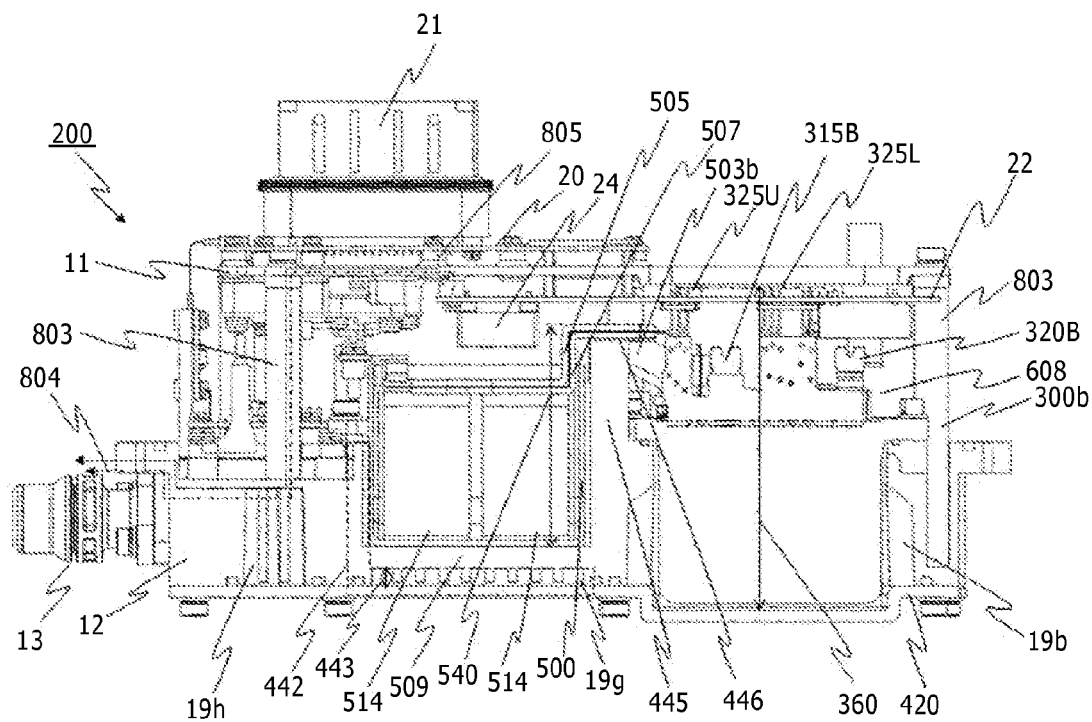
FIG. 12 is a cross-sectional view of a power conversion apparatus 200 taken along the A-A plane in FIG. 3.

FIG. 12 is a cross-sectional view of the power conversion apparatus 200 taken along the line A-A of FIG. 3. The power semiconductor module 300b is housed in the second flow path part 19b shown in FIG. 5. The outside wall of the module case 304 is directly brought into contact with the cooling refrigerant flowing through the second flow path part 19b. Similarly to the power semiconductor module 300b, the other power semiconductor modules 300a and 300c as well as the power semiconductor modules 301a to 301c are also housed in each of the flow path parts.

The semiconductor module 300b is provided on a side portion of the capacitor module 500. A height 540 of the capacitor module is made smaller than a height 360 of the power semiconductor module. Here, the height 540 of the capacitor module is the height from a bottom portion 513 of the capacitor case 502 to the capacitor terminal 503b. The height 360 of the power semiconductor module is the height from the bottom portion of the module case 304 to the tip of the signal terminal 325U.

Then, the second flow path forming body 442 is provided with the seventh flow path part 19g placed below the capacitor module 500. In other words, the seventh flow path part 19g is arranged side by side with the capacitor module 500, along the height direction of the power semiconductor module 300b. A height 443 of the seventh flow path part is smaller than the difference between the height 360 of the power semiconductor module and the height 540 of the capacitor module. Note that the height 443 of the seventh flow path part may be equal to the difference between the height 360 of the power semiconductor module and the height 540 of the capacitor module.

As the power semiconductor module 300b and the capacitor module 500 are arranged adjacent to each other, the connection distance is short, so that it is possible to achieve low inductance and low loss.

Meanwhile, the power semiconductor module 300b and the capacitor module 500 can be fixed and connected on the same plane, so that it is possible to increase the ease of assembly.

Meanwhile, as the height 540 of the capacitor module is reduced to be smaller than the height 360 of the power semiconductor module, the seventh flow path part 19g can be provided below the capacitor module 500, so that it is possible to also cool the capacitor module 500. Further, the distance between the height of the upper portion of the capacitor module 500 and the height of the upper portion of the power semiconductor module 300b is short, so that it is possible to prevent the length of the capacitor terminal 503b from increasing in the height direction of the capacitor module 500.

Meanwhile, by arranging the seventh flow path part 19g below the capacitor module 500, it is possible to avoid the cooling flow path from being placed on the side portion of the capacitor module 500, and to bring the capacitor module 500 and the power semiconductor module 300b close to each other. In this way, it is possible to prevent the wiring distance between the capacitor module 500 and the power semiconductor module 300b from being increased.

Further, the driver circuit board 22 is mounted with a transformer 24 to generate a driving power of the driver circuit. The height of the transformer 24 is greater than the height of the circuit components mounted on the driver circuit board 22. The signal terminal 325U and the DC positive electrode terminal 315B are placed in the space between the driver circuit board 22 and the power semiconductor modules 301a to 301c. Meanwhile, the transformer 24 is placed in the space between the driver circuit board 22 and the capacitor module 500. In this way, it is possible to effectively use the space between the driver circuit board 22 and the capacitor module 500. Further, the circuit components with the same heights are mounted on the surface opposite the surface on which the driver circuit board 22 and the transformer 24 are provided. In this way, it is possible to reduce the distance between the driver circuit board 22 and the metal base plate 11.

Figure 13:
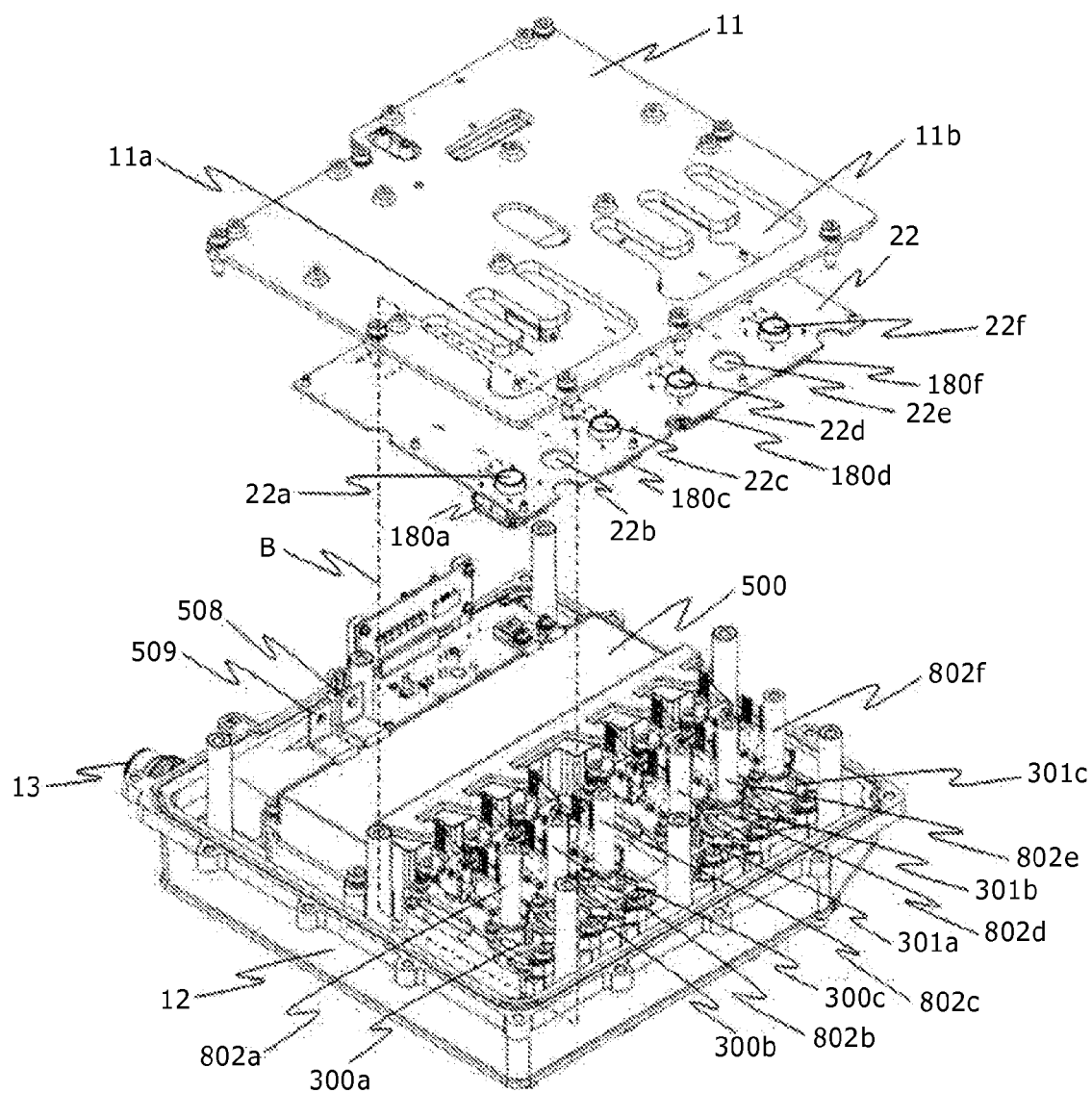
FIG. 13 is an exploded perspective view of a driver circuit board 22 and a metal base plate 11 with a lid 8 and a control circuit board 20 removed.

FIG. 13 is an exploded perspective view of the driver circuit board 22 and the metal base plate 11, in which the lid 8 and the control circuit board 20 are removed.

The driver circuit board 22 is placed above the power semiconductor modules 300a to 300c and the power semiconductor modules 301a to 301c. The metal base plate 11 is provided on the opposite side of the power semiconductor modules 300a to 300c and the power semiconductor modules 301a to 301c with the driver circuit board 22 therebetween. the driver circuit board 22 forms a through hole 22a passing through the AC-side relay conductor 802a, a through hole 22b passing through an AC-side relay conductor 802b, a through hole 22c passing through the AC-side relay conductor 802c, a through hole 22d passing through an AC-side relay conductor 802d, a through hole 22e passing through an AC-side relay conductor 802e, and a through hole 22f passing through an AC-side relay conductor 802f, respectively. Note that in the present embodiment, a current sensor 180a is fitted into the through hole 22a, a current sensor 180c is fitted into the through hoe 22c, a current sensor 180d is fitted into the through hole 22d, and a current sensor 180f is fitted into the through hole 22f. However, it is also possible to provide current sensors to all the through holes 22a to 22f.

By providing the through holes 22a to 22f in the driver circuit board 22, it is possible to directly provide the current sensors in the driver circuit board 22. Thus, the wiring of the AC-side relay conductors 802a to 802f can be simplified, contributing to downsizing.

In the metal base plate 11, a through hole 11a is formed at a position facing the through holes 22a to 22c, and a through hole 11b is formed at a position facing the through holes 22d to 22f. Further, as shown in FIG. 3, the lid 8 forms the third opening 204a at a position facing the through hole 11a to form the AC connector 188. Further, the lid 8 forms the fourth opening 204b at a position facing the through hole 11b to form the AC connector 159.

In this way, even if the driver circuit board 22 is provided between the AC connector 188 and the power semiconductor modules 301a to 301c, it is possible to prevent the wiring of the AC-side relay conductors 802a to 802f from being complicated. Thus, downsizing of the power conversion apparatus 200 can be achieved.

Further, each of the power semiconductor modules 300a to 300c and 301a to 301c has a rectangular shape with a side in the longitudinal direction and a side in the short direction. Similarly, the capacitor module 500 has a rectangular shape with a side in the longitudinal direction and a side in the short direction. Then, the power semiconductor modules 300a to 300c and 301a to 301c are arranged so that the respective sides in the short direction are placed in a line along the longitudinal direction of the capacitor module 500.

Because of this arrangement, the distance between the power semiconductor modules 300a to 300c approaches, so that the distance between the capacitor terminals 503a to 503 can be reduced. As a result, it is possible to reduce the heat generated by the return current flowing between the power semiconductor modules 300a to 300c. This is the same for the power semiconductor modules 301a to 301c.

A support member 803 of metal protrudes from the flow path forming body 12 and is connected to the flow path forming body 12. The metal base plate 11 is supported at the tip portion of the support member 803. The flow path forming body 12 is electrically coupled to the ground. A flow 804 of leakage current shows the flow direction of a leakage current flowing from the driver circuit board 22 to the metal base plate 11, the support member 803, and to the flow path forming body 12, sequentially. Further, a flow 805 of leakage current shows the flow direction of a leakage current flowing from the control circuit board 20 to the metal base plate 11, the support member 803, and to the flow path forming body 12, sequentially. In this way, the leakage current of the control circuit board 20 and the driver circuit board 22 can flow through the ground effectively.

As shown in FIG. 3, the control circuit board 20 is placed facing one surface of the lid 8 that forms the first opening 202. Then, the connector 21 is directly mounted on the control circuit board 20, projecting to the outside through the first opening 202 formed in the lid 8. In this way, it is possible to effectively use the space of the interior of the power conversion apparatus 200.

Further, the control circuit board 20 on which the connector 21 is mounted is fixed to the metal base plate 11. Thus, even if a physical force is applied from the outside to the connector 21, the load on the control circuit board 20 is reduced, so that it is expected that the reliability including durability will be increased.

Figure 14:
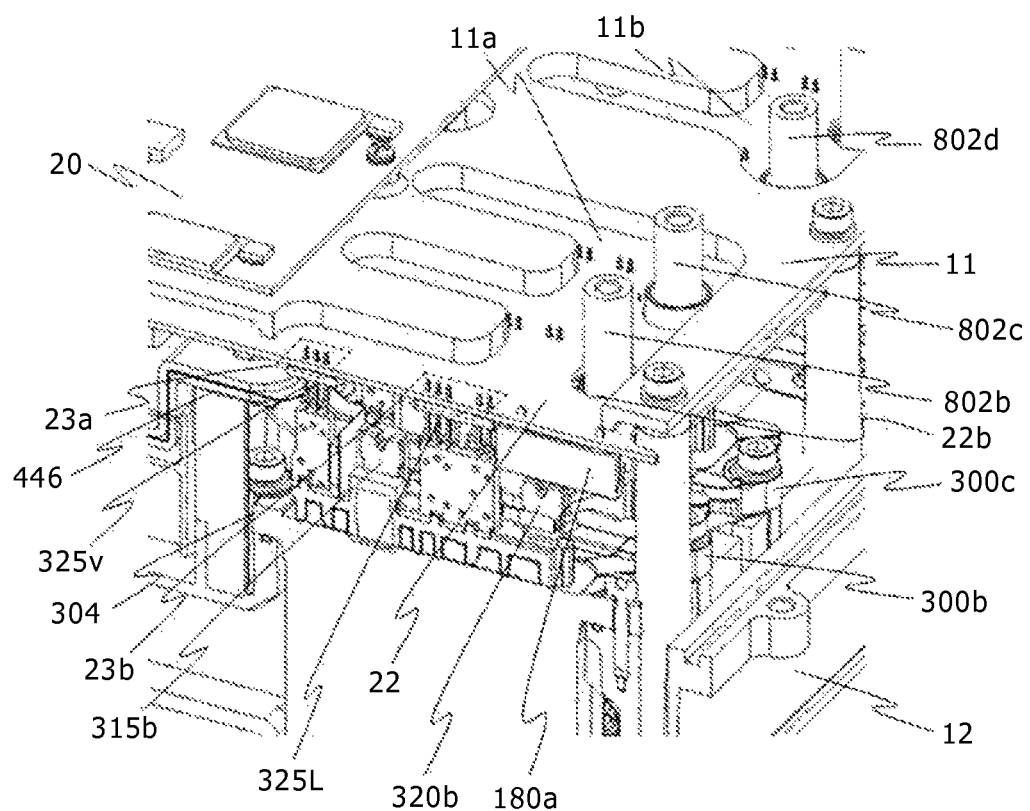
FIG. 14 is a cross-sectional perspective view taken along the planes B in FIG. 13.

FIG. 14 is a cross-sectional perspective view taken along the plane B of FIG. 13. A connection part 23a is the connection part of the signal terminal 325U of the power semiconductor module 301a and the driver circuit board 22. A connection part 23b is the connection part of the signal terminal 325L of the power semiconductor module 301a and the driver circuit board 22. The connection parts 23a and 23b are formed by a solder material.

The through hole 11a of the metal base plate 11 is formed to the position facing the connection parts 23a and 23b. Because of this structure, it is possible to perform the connection operation of the connection parts 23a and 23b through the through hole 11a of the metal base plate 11, with the driver circuit board 22 fixed to the metal base plate 11.

Further, the control circuit board 20 is arranged in such a way that when it is projected from the upper surface of the power conversion apparatus 200, the projected portion of the control circuit board 20 does not overlap the projected portion of the through hole 11a. Because of this arrangement, the control circuit board 20 does not interfere with the connection operation of the connection parts 23a and 23b. At the same time, the control circuit board 20 can reduce the influence of the electromagnetic noise from the connection parts 23a and 23b.

Figure 15:
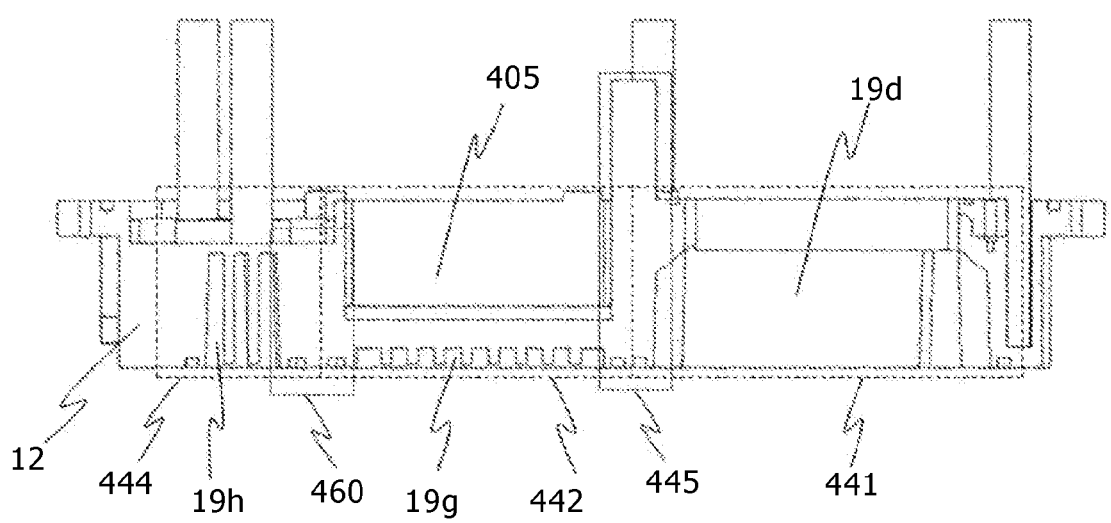
FIG. 15 is a cross-sectional view taken along the plane C of the flow path forming body 12 shown in FIG. 5.

FIG. 15 is a cross-sectional view taken along the plane C of the flow path forming body 12 shown in FIG. 5. The flow path forming body 12 integrally forms the first flow path forming body 441 that forms the first to sixth flow path parts 19a to 19f, and the second flow path forming body 442 that forms the seventh flow path part 19g. The first flow path forming body 441 is provided on a side portion of the second path forming body 442. The second flow path forming body 442 forms the housing space 405 for housing the capacitor module 500 above the seventh flow path part 19g. Further, the flow path forming body 12 has a wall 445 for forming the side wall of the housing space 405 as well as a part of the seventh flow path part 19g. In other words, the first to sixth flow path parts 19a to 19f are formed at a position facing the wall 445.

In this way, not only the bottom of the capacitor module 500 is cooled by the seventh flow path part 19g, but also the side surface in the height direction of the capacitor module 500 is cooled by the first to sixth flow path parts 19a to 19f. As a result, the cooing performance of the capacitor module 500 is improved.

Further, the wall 445 forms a part of the housing space 405, a part of the seventh flow path part 19g, and a part of the fourth flow path part 19d. Because of this structure, the housing space to be cooled can be divided by the wall 445, so that it is possible to cool down in the unit of module in each of the capacitor module and the power semiconductor module. As a result, it is possible to select the priority of the space to be cooled for each housing space.

Further, the flow path forming body 12 integrally forms the first flow path forming body 441, the second flow path forming body 442, and the third flow path forming body 444 that forms the eighth flow path part 19h. The third flow path forming body 444 is provided on a side portion of the second flow path forming body 442. The flow path forming body 12 has a wall 460 for forming the side wall of the housing space 405 and a part of the eighth flow path part 19h. In other words, the eighth flow path part 19h is formed at a position facing the wall 460. Because of this structure, not only the bottom of the capacitor module 500 is cooled by the seventh flow path part 19h, but also the side surface in the height direction of the capacitor module 500 is cooled by the eighth flow path part 19h. Thus, the cooling performance of the capacitor module 500 is further increased.

Further, the flow path forming body 12 is integrally formed with the third flow path forming body 444 that forms the eighth flow path part 19h, in order to further simplify the structure.

Further, as shown in FIG. 12, the capacitor terminals 503a to 503f are formed over the upper portion of the wall 445. In this way, it is possible to reduce the influence of the heat transferred between the capacitor module and the power semiconductor module.

Note that, as shown in FIG. 12, an insulating member 446 is provided in an upper end of the wall 445 and is brought into contact with the relay conductor part 530 shown in FIG. 11. In this way, it is possible to further reduce the influence of the heat transferred between the capacitor module and the power semiconductor module.

Figure 16:
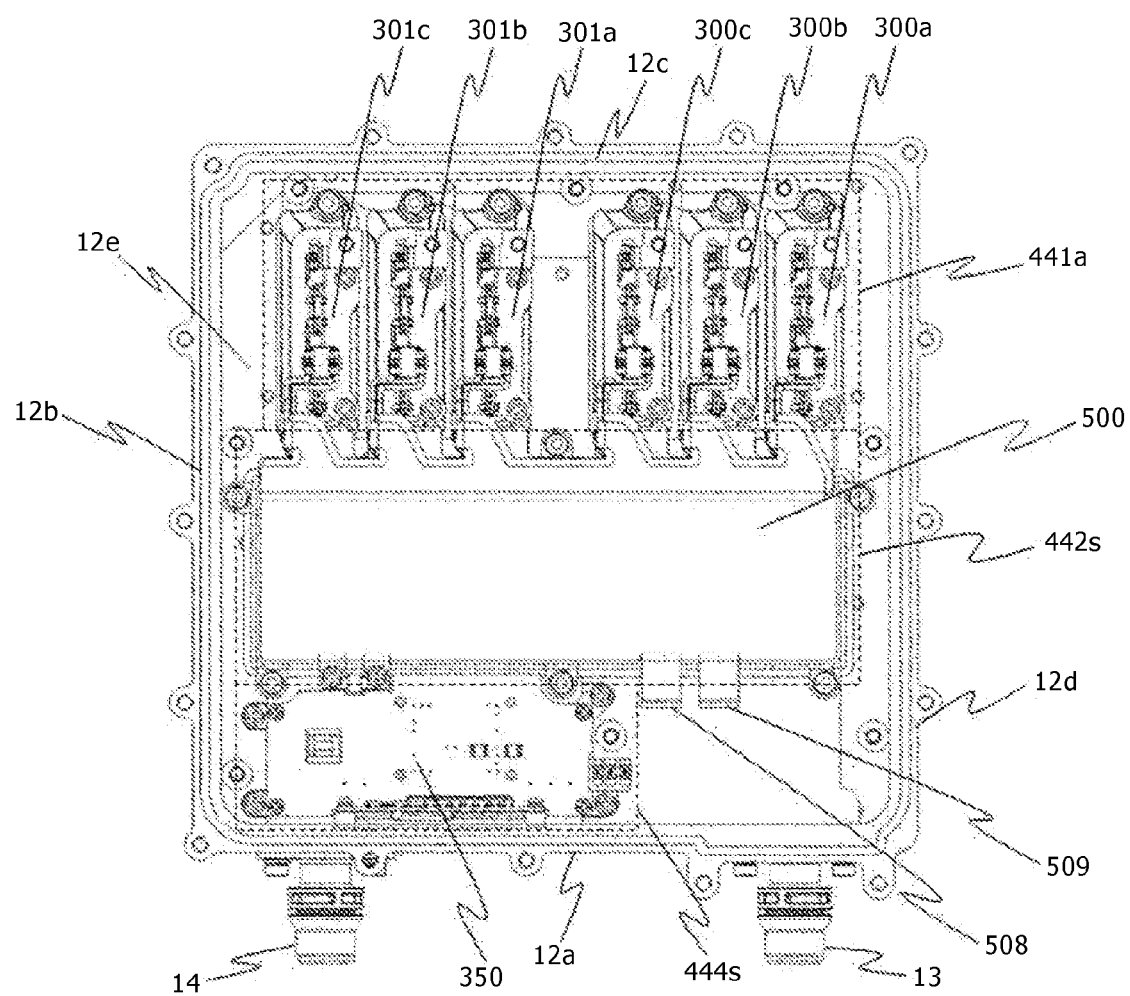
FIG. 16 is a top surface view of the power conversion apparatus 200 with the lid 8, the control circuit board 20, the metal base plate 11, and the driver circuit board 22 being removed.

FIG. 16 is an upper surface view of the power conversion apparatus 200, in which the lid 8, the control circuit board 20, the metal base plate 11, and the driver circuit board 22 are removed.

When the power conversion apparatus 200 is projected from the upper surface, reference numeral 441s indicates the projected portion of the first flow path forming body 441, 442s indicates the projected portion of the second flow path forming body 442, and 444s indicates the projected portion of the third flow path forming body 444. The auxiliary power module 350 is arranged so as to overlap the projected portion 444s of the third flow path forming body 444. In this way, it is possible to cool the auxiliary power module 350 by the cooling refrigerant flowing through the eighth flow path part 19h.

Further, the first flow path forming body 441 and the second flow path forming body 442 are arranged facing a side wall 12b, side wall 12b, side wall 12c, and side wall 12d of the flow path forming body 12 through a void portion 12e with an air layer. In this way, even if there is a difference between the temperature of the cooling refrigerant flowing through the first flow path forming body 441 and the second flow path forming body 442 and the external ambient temperature, the void portion 12e serves as a heat insulating layer to be able to prevent the first flow path forming body 441 and the second flow path forming body 442 from being affected by the external ambient temperature of the power conversion apparatus 200.

LIST OF REFERENCE SIGNS

8: lid
11: metal base plate
11a, 11b, 22a to 22f: through hole
12: flow path forming body
12a to 12d: side wall
12e: void portion
13: inlet pipe
14: outlet pipe
19a: first flow path part
19b: second flow path part
19c: third flow path part
19d: fourth flow path part
19e: fifth flow path part
19f: sixth flow path part
19g: seventh flow path part
19h: eighth flow path part
20: control circuit board
21: connector
22: driver circuit board
23a, 23b, 370: connection part
24: transformer
120, 159, 320B: AC terminal
136: battery
138: DC connector
140, 142, 350B: inverter circuit
150: upper and lower arm series circuit
153, 163: collector electrode
154, 164: gate electrode
155: signal emitter electrode
156, 166: diode
157: positive electrode terminal
158: negative electrode terminal
160: metal bonding material
165: signal emitter electrode
168: intermediate electrode
172: control circuit
174, 350A: driver circuit
180, 180a to 180f: current sensor
188: AC connector
195: auxiliary motor
200: power conversion apparatus
202: first opening
203: second opening
204a: third opening
204b: fourth opening
205: fifth opening
300a to 300c, 301a to 301c: power semiconductor module
302: module primary sealant
304: module case
304A: thin wall portion
304B: flange
305: fin
306: insertion opening
307A: first radiating surface
307B: second radiating surface
309: screw
315, 318, 319, 320: conductor plate
315A: DC positive electrode wiring
315B: DC positive electrode terminal
315C: auxiliary module-side DC positive electrode connection terminal
315D: element-side DC positive electrode connection terminal
319A: DC negative electrode wiring
319B: DC negative electrode terminal
319C: auxiliary module-side DC negative electrode connection terminal
319D: element-side DC negative electrode connection terminal
320A: AC wiring
320C: auxiliary module-side AC connection terminal
320D: element-side AC connection terminal
322: element fixing part
324U, 324L: signal wiring
325L, 325U: signal terminal
326L, 326U: auxiliary module-side signal connection terminal
327L, 327U: element-side signal connection terminal
328, 330: IGBT
328A, 330A: control electrode 329: intermediate electrode
333, 446: insulating member
348: first sealing resin
350: auxiliary power module
351: second sealing resin
360: height of power semiconductor module
371: bonding wire
372: tie bar
400a to 400c, 402a to 402c, 404: opening portion
405: housing space
406a to 406f: protruding portion
407: cooling part
409: seal member
417: flow direction
420: lower cover
441: first flow path forming body
441s: projected portion of first flow path forming body
442: second flow path forming body
442s: projected portion of second flow path forming body
443: height of seventh flow path part
444: third flow path forming body
444s: projected portion of third flow path forming body
445, 460: wall
447, 448: straight fin
500: capacitor module
501: laminated conductor plate
502: capacitor case
503a to 503f: capacitor terminal
504: negative side capacitor terminal
505: negative electrode conductor plate
506: positive side capacitor terminal
507: positive electrode conductor plate
508: battery negative terminal
509: battery positive terminal
510: negative side power line
511: housing part
512: positive side power line
513: bottom portion
514: capacitor cell
515a, 515b: noise filter capacitor cell
516, 517: auxiliary capacitor terminal
520a to 520d: hole
530: relay conductor part
540: height of capacitor module
550: insulating sheet
551: filling material
600: auxiliary mold body
608: wiring insulating portion
802: AC bus bar
802a to 802f: AC-side relay conductor
803: support member
804, 805: flow of leakage current
DEF: differential gear
EGN: engine
MG1, MG2: motor generator
TM: transmission
TSM: power transfer mechanism

The invention claimed is:

1. A power conversion apparatus comprising:
a first power semiconductor module including a power semiconductor element for converting a direct current to an alternating current;
a capacitor module including a capacitor element for smoothing the direct current; and
a flow path forming body for forming a flow path through which a cooling refrigerant flows,
wherein the flow path forming body has a first flow path forming body that forms a first flow path part for cooling the first power semiconductor module, and a second flow path forming body that forms a second flow path part for cooling the capacitor module,
wherein the first flow path forming body is provided on a side portion of the second flow path forming body and is integrally formed with the second flow path forming body,
wherein the second flow path forming body forms a housing space for housing the capacitor module above the second flow path part,
wherein the first flow path part is formed at a position facing the side wall that forms the housing space, and
wherein the first power semiconductor module is inserted into the first flow path part.

2. The power conversion apparatus according to claim 1, wherein the sum of the height of the capacitor module and the height of the second flow path part is smaller than the height of the first power semiconductor module.

3. The power conversion apparatus according to claim 1, wherein the capacitor module has a capacitor-side conductor plate that is connected to the capacitor element, and wherein the capacitor-side conductor plate is provided between the capacitor element and the side wall that forms the housing space.

4. The power conversion apparatus according to claim 1, comprising:
a driver circuit board provided in the upper portion of the first power semiconductor module;
a metal base plate provided on the opposite side of the first power semiconductor module with the driver circuit board interposed therebetween; and
an AC-side conductor protruding from the power semiconductor module to the driver circuit board,
wherein the driver circuit board forms a first through hole passing through the AC-side conductor, and
wherein the metal base plate forms a second through hole passing through the AC-side terminal at a position facing the first through hole.

5. The power conversion apparatus according to claim 1, comprising:
a driver circuit board provided in the upper portion of the first power semiconductor module; and
a metal base plate provided on the opposite side of the first power semiconductor module with the driver circuit board interposed therebetween,
wherein the driver circuit board has a connection part of the driver circuit board and a signal terminal extending from the first power semiconductor module, and
wherein the metal base plate forms a through hole at a position facing the connection part.

6. The power conversion apparatus according to claim 5, comprising a DC-side conductor for transferring the direct current by connecting the first power semiconductor module and the capacitor module to each other,
wherein the flow path forming body has a wall that forms a part of the side wall of the housing space and a part of the side wall of the first flow path part, and
wherein the DC-side conductor is placed over the wall.

7. The power conversion apparatus according to claim 6, comprising an insulation member that is provided in the space between the DC-side conductor and the wall, and is brought into contact with the DC-side conductor and the wall.

8. The power conversion apparatus according to claim 1, comprising a second power semiconductor module for driving an auxiliary motor that is different from the motor driven by the first power semiconductor module,
  wherein the flow path forming body has a third flow path forming body that forms a third flow path part for cooing the second power semiconductor module,
  wherein the third flow path part is formed in such a way that when it is projected along the arrangement direction of the capacitor module and the second flow path part, the shadow portion of the third flow path part does not overlap the shadow portion of the capacitor module and the first power semiconductor module, and
  wherein the second power semiconductor module is provided at a position facing the third flow path part.

9. The power conversion apparatus according to claim 1, comprising:
  a driver circuit board for driving the power semiconductor element;
  an AC-side conductor for transferring the alternating current;
  a case for housing the first power semiconductor module, the capacitor module, the driver circuit board, and the AC-side conductor; and
  an AC connector,
  wherein the driver circuit board is provided facing the power semiconductor module,
  wherein the AC-side connector is provided on one surface of the case so as to face the power semiconductor module with the driver circuit board interposed therebetween, and
  wherein the AC-side conductor is connected to the AC-side connector, passing through the through hole formed in the driver circuit board from the AC-side terminal.

10. The power conversion apparatus according to claim 1, comprising a driver circuit board that drives the power semiconductor element, and is mounted with a transformer for generating a drive power of a driver circuit,
  wherein the driver circuit board is provided facing the first power semiconductor module and the capacitor module, and
  wherein the transformer is provided at a position facing the capacitor module.

11. The power conversion apparatus according to claim 1, comprising a case for housing the first power semiconductor module, the capacitor module, and the flow path forming body,
  wherein the case has a void portion so that the area surrounding the capacitor module has an air layer.

12. The power conversion apparatus according to claim 1, wherein the flow path forming body has a straight fin protruding to the inside of the second flow path.

13. The power conversion apparatus according to claim 1, wherein a plurality of the first power semiconductor modules are provided, each having a rectangular shape with a side in the longitudinal direction and a side in the short direction,
  wherein the capacitor module has a rectangular shape with a side in the longitudinal direction and a side in the short direction,
  wherein the plurality of power semiconductor modules are provided so that the sides in the short direction of the power semiconductor modules are arranged in a line along the side in the longitudinal direction of the capacitor module, and
  wherein the flow path forming body is formed so that the first flow path allows the cooing refrigerant to flow between the power semiconductor modules.

14. The power conversion apparatus according to claim 1, comprising:
  a driver circuit board for driving the power semiconductor element;
  a control circuit board for outputting a control signal of the power semiconductor element to the driver circuit board;
  a case for housing the first power semiconductor module, the capacitor module, the driver circuit board, and the control circuit board;
  a metal base supported by a support member protruding from the case; and
  an AC-side connector facing the first power semiconductor module with the metal base interposed therebetween,
  wherein the metal base that holds the driver circuit board on the side on which the first power semiconductor module is provided, and holds the control circuit board on the side on which the AC-side connector is provided, and
  wherein the case is electrically coupled to the ground.

15. The power conversion apparatus according to claim 14, comprising a control-side connector for transferring an instruction signal of a motor drive mounted on a vehicle,
  wherein the control-side connector is provided on one surface of the case where the AC-side connector is provided.

* * * * *